United States Patent
Zhu

(10) Patent No.: US 11,424,323 B2
(45) Date of Patent: Aug. 23, 2022

(54) SEMICONDUCTOR DEVICE WITH C-SHAPED ACTIVE AREA AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 74 days.

(21) Appl. No.: 17/112,690

(22) Filed: Dec. 4, 2020

(65) Prior Publication Data
US 2021/0175333 A1    Jun. 10, 2021

(30) Foreign Application Priority Data
Dec. 6, 2019   (CN) .......................... 201911256093.3

(51) Int. Cl.
*H01L 29/10*  (2006.01)
*H01L 29/78*  (2006.01)
(Continued)

(52) U.S. Cl.
CPC ...... *H01L 29/1037* (2013.01); *H01L 27/0924* (2013.01); *H01L 29/0847* (2013.01); *H01L 29/7848* (2013.01); *H01L 29/0676* (2013.01)

(58) Field of Classification Search
CPC ..... H01L 21/823481; H01L 21/823885; H01L 27/0924; H01L 29/0676; H01L 29/0847;
(Continued)

(56) References Cited

U.S. PATENT DOCUMENTS 6,635,924 B1* 10/2003 Hergenrother .............................. H01L 21/823487
257/E21.629
9,368,512 B1*  6/2016 Cheng ................... H01L 29/785
(Continued)

FOREIGN PATENT DOCUMENTS

| CN | 107887384 A | 4/2018 |
| CN | 107887444 A | 4/2018 |
| CN | 109888001 A | 6/2019 |

*Primary Examiner* — David C Spalla
(74) *Attorney, Agent, or Firm* — Haynes and Boone, LLP

(57) ABSTRACT

A semiconductor device with a C-shaped active area and an electronic apparatus including the same is disclosed. The semiconductor device may include a first device and a second device opposite to each other on a substrate, each of which includes: a channel portion extending vertically on the substrate; source/drain portions located at the upper and lower ends of the channel portion and along the channel portion, the source/drain portions and the channel portion constitute a C-shaped structure; and a gate stack overlapping the channel portion on an inner sidewall of C-shaped structure, the gate stack has a portion surrounded by the C-shaped structure. The openings of the C-shaped structures of the two devices are opposite to each other. At least a portion of the gate stack of the first device close to the channel portion and that of the second device close to the channel portion are substantially coplanar.

31 Claims, 26 Drawing Sheets

(51) Int. Cl.
    *H01L 29/08*    (2006.01)
    *H01L 27/092*   (2006.01)
    *H01L 29/06*    (2006.01)

(58) Field of Classification Search
    CPC ........... H01L 29/1037; H01L 29/66666; H01L 29/7827; H01L 29/7848; H01L 29/78642; H01L 29/7788
    See application file for complete search history.

(56) References Cited

U.S. PATENT DOCUMENTS

| | | | | |
|---|---|---|---|---|
| 2007/0012996 | A1* | 1/2007 | Yoon | H01L 27/115 257/329 |
| 2007/0082448 | A1* | 4/2007 | Kim | H01L 27/10876 257/E21.41 |
| 2007/0181925 | A1* | 8/2007 | Yoon | H01L 29/66666 257/296 |
| 2007/0246783 | A1* | 10/2007 | Moon | H01L 29/1037 257/E21.627 |
| 2016/0064541 | A1* | 3/2016 | Diaz | H01L 29/42392 257/329 |
| 2018/0097106 | A1 | 4/2018 | Zhu | |

* cited by examiner

SEMICONDUCTOR DEVICE WITH C-SHAPED ACTIVE AREA AND ELECTRONIC APPARATUS INCLUDING THE SAME

CROSS-REFERENCE TO RELATED APPLICATION

This application claims the benefit of Chinese Patent Application No. 201911256093.3 filed on Dec. 6, 2019 in the State Intellectual Property Office of China, the whole disclosure of which is incorporated herein by reference.

TECHNICAL FIELD

The present disclosure relates to the field of semiconductor, more particularly, to a semiconductor device with a C-shaped active area and a manufacturing method thereof and an electronic apparatus including the semiconductor device.

BACKGROUND

With the continuous miniaturization of semiconductor devices, devices with various structures such as fin field effect transistors (FinFET), multi-bridge transistor field effect transistors (MBCFET), etc. have been proposed. However, these devices still may not meet the requirements due to the limitation of device structure in terms of increasing integration density and enhancing device performance.

SUMMARY

In view of this, it is at least part of the purpose of the present disclosure to provide a semiconductor device with a C-shaped active area and an electronic apparatus including the semiconductor device.

According to one aspect of the present disclosure, a semiconductor device is provided, comprising a first device and a second device opposite to each other on a substrate, each of the first device and the second device comprises: a channel portion extending vertically on the substrate; source/drain portions located at the upper and lower ends of the channel portion, wherein the source/drain portions extend toward a side of the channel portion in a transverse direction relative to the substrate, so that the source/drain portions and the channel portion constitute a C-shaped structure; and a gate stack that overlaps the channel portion on the inner sidewall of the C-shaped structure, wherein the gate stack has a portion surrounded by the C-shaped structure. The opening of the C-shaped structure of the first device and the opening of the C-shaped structure of the second device are opposite to each other. A portion of the gate stack of the first device at least close to the channel portion and the portion of the gate stack of the second device at least close to the channel portion are substantially coplanar.

According to another aspect of the present disclosure, an electronic apparatus is provided, comprising the above-mentioned semiconductor device.

According to the embodiments of the present disclosure, a semiconductor device with a new structure is provided, which has advantages of high performance and high density.

BRIEF DESCRIPTION OF THE DRAWINGS

The aforementioned and other objectives, features and advantages would become more apparent through the following description of the embodiments of the present disclosure with reference to the accompany drawings, in the accompanying drawings:

FIGS. 1(a)-22(d) schematically show some stages in the process of manufacturing a semiconductor device according to the embodiments of the present disclosure, wherein FIGS. 1(a), 3(a), 4, 5(a), 8(a), 14(a), 16(a), 17(a), 17(b), 18(a), 19(a), 22(a) are top views, FIGS. 1(b), 2, 3(b), 9(a), 13(a), 14(b) are cross-sectional views along AA' line, FIGS. 1(c), 3(c), 4(b), 5(b), 6, 7, 8(b), 9(b), 10, 11, 12, 13(b), 14(c), 15, 16(b), 18(b), 19(b), 20(a), 21(a), 22(b) are cross-sectional views along BB' line, FIGS. 16(d), 18(d), 19(d), 20(c), 21(c), 22(d) are cross-sectional views along EE' line.

Throughout the drawings, the same or similar reference numerals indicate the same or similar components.

DETAILED DESCRIPTION OF EMBODIMENTS

Figure 1A:
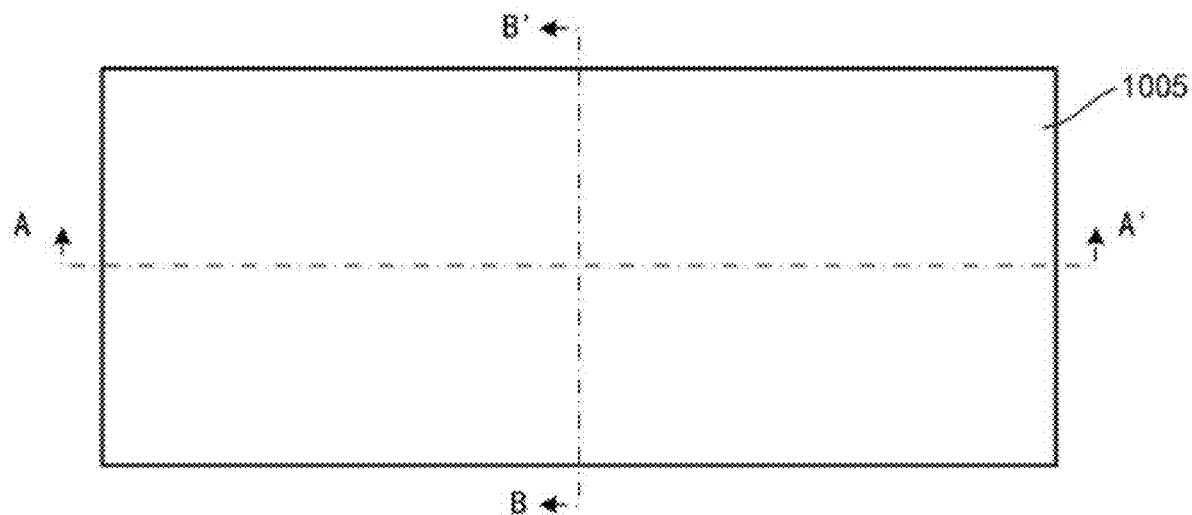

Hereinafter, embodiments of the present disclosure will be described with reference to the drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

Various structural schematic diagrams according to embodiments of the present disclosure are shown in the drawings. The figures are not drawn to scale, some details are enlarged and some details may be omitted for clarity of presentation. The shapes of the various areas and layers shown in the figures and the relative size and positional relationships between them are only exemplary. In practice, there may be deviations due to manufacturing tolerances or technical limitations, and those skilled in the art may design regions/layers having different shapes, sizes, relative positions in addition according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

According to the embodiments of the present disclosure, a semiconductor device is provided, comprising a first device and a second device opposite to each other. The first device and the second device may each be a vertical type semiconductor device having an active area arranged vertically on a substrate (for example, in a direction substantially perpendicular to the surface of the substrate). The channel portion may be a vertical nano-sheet, so this device may be called a vertical nano-sheet FET (VNSFET). Compared with a nano-sheet device in which the nanosheet is arranged transversely with respect to the substrate, the VNSFET may save area. As described below, the nano-sheet may be formed by epitaxial growth, so it may be a single piece and may have a substantially uniform thickness. According to the embodiments, the nanosheet may have a linear shape extending along a first direction in a plan view. The respective C shapes of the first device and the second device may be opposite to each other.

The first device and the second device may further include source/drain portions respectively provided at the upper and lower ends of the channel portion. As stated below, the source/drain portions of the first device and the second device may be defined by the same material layer, so that they may be substantially coplanar (for example, the upper surfaces are substantially coplanar and/or the lower surfaces are substantially coplanar). The source/drain portions may be arranged along the channel portion. According to the embodiments, the source/drain portions may protrude toward a side of the channel portion in a transverse direction with respect to the substrate (for example, the second direction intersecting (such as perpendicular to) the first direction), so that the source/drain portions and the channel portion constitute a C-shaped structure. The protrusion extent of the source/drain portion of the first device relative to the channel portion and the protrusion extent of the source/drain portion of the second device relative to the channel portion may be substantially the same.

The C-shaped structure formed by the channel portion and the source/drain portions (that is, the active area) may help define a space for accommodating the gate stack. As described below, the gate stacks of the first device and the second device may be defined by the same material layer, so their end portions at least on the side close to the channel portions may be substantially coplanar (for example, the upper surfaces are substantially coplanar and/or the lower surfaces are substantially coplanar).

The source/drain portion may have a certain doping. For example, for a p-type device, the source/drain portion may have a p-type doping; for an n-type device, the source/drain portion may have an n-type doping. A doped profile of the source/drain portion may have an end portion that overlaps the gate stack to reduce external resistance. The channel portion may have a certain doping to adjust the threshold voltage of the device. Alternatively, the semiconductor device may be a junctionless device, wherein the channel portion and the source/drain portions may have the same conductivity type doping. Alternatively, the semiconductor device may be a tunneling type device, wherein the source/drain portions at both ends of the channel portion may have opposite doping types to each other.

The channel portion may include a single crystal semiconductor material. Of course, the source/drain portion may also include a single crystal semiconductor material. For example, they may all be formed by epitaxial growth.

The active area of the device may be located between isolation layers in the first direction. The gate conductor in the gate stack may extend from the region where the C-shaped structure is located to the region where the isolation layer is located, and the region where the isolation layer is located may have a relatively increased area, so as to form landing pads for the gate contact portion.

Such a semiconductor device may be manufactured as follows, for example.

According to an embodiment, a stack of a first material layer, a second material layer, and a third material layer may be provided on the substrate. The first material layer may define the position of the lower source/drain portion, the second material layer may define the position of the gate stack, and the third material layer may define the position of the upper source/drain portion. The first material layer may be provided through a substrate, such as the upper portion of the substrate. Alternatively, the first material layer, the second material layer, and the third material layer may be formed in sequence on the substrate by, for example, epitaxial growth. If the first material layer and the third material layer are directly used as the source/drain portion below, they may be doped in situ while being epitaxially grown.

The stack may be patterned into a bar shape extending in the first direction. On the opposite sidewalls of the bar-shaped stack in a second direction intersecting (for example, perpendicular to) the first direction, a first active layer may be formed. The first active layer may define the channel portion. A device may be formed based on the first active layer on the each opposite sidewalls. Thus, based on a single bar-shaped stack, two devices facing each other may be formed. The two devices may have different conductivity types, so that a complementary metal oxide semiconductor (CMOS) configuration may be formed.

The gate stack may be formed between the opposite first active layers. For this, an opening may be formed in the bar-shaped stack to form a space between the first active layers. The opening may also extend substantially in the first direction, so that the above-mentioned stack is divided into two portions that are substantially the same, which facilitates formation of the source/drain portions along the channel portion. The second material layer may be replaced with a gate stack through the opening formed in this way.

In order to facilitate the formation of the source/drain portion, for example, the source/drain portion may be formed by doping the first material layer and the third material layer (especially when they are not doped while being formed), or may be formed by growing the second active layer additionally as described below, a dummy gate may be formed first. For example, the second material layer may be removed by selective etching through the above-mentioned opening, thus a space is formed between the first material layer and the second material layer. A dummy gate may be formed in this space. The dummy gate covers the portion of the first active layer between the first material layer and the second material layer.

The source/drain portions may be formed on the upper and lower sides of the dummy gate. For example, the source/drain portions may be formed by doping the first material layer and the third material layer. The doping may be achieved by a solid phase dopant source layer. Alternatively, the first material layer and the third material layer may be at least partially removed (or even completely removed to expose the first active layer), and the second active layer may be grown on the upper and lower sides of the dummy gate. The second active layer may be doped in situ during growth Impurities may be activated by annealing, so that the impurities may diffuse into the first active layer and overlap with the end portion of the dummy gate to a certain extent.

After that, the dummy gate may be replaced with a gate stack by a replacement gate process.

The present disclosure may be presented in various forms, some examples of which will be described below. In the following description, selection of various materials is involved. In addition to the function thereof (for example, semiconductor materials are used to form active areas and dielectric materials are used to form electrical isolation), the selection of materials also considers etching selectivity. In the following description, the required etching selectivity may be or may not be indicated. It should be clear to those skilled in the art that when etching a certain material layer is mentioned below, if it is not mentioned that other layers are also etched or the figures do not show that other layers are also etched, then the etching may be selective, and the material layer may have etching selectivity relative to the other layers exposed to the same etching recipe.

FIGS. 1 to 22(*d*) schematically show some stages in the process of manufacturing a semiconductor device according to the embodiments of the present disclosure.

Figure 1B:
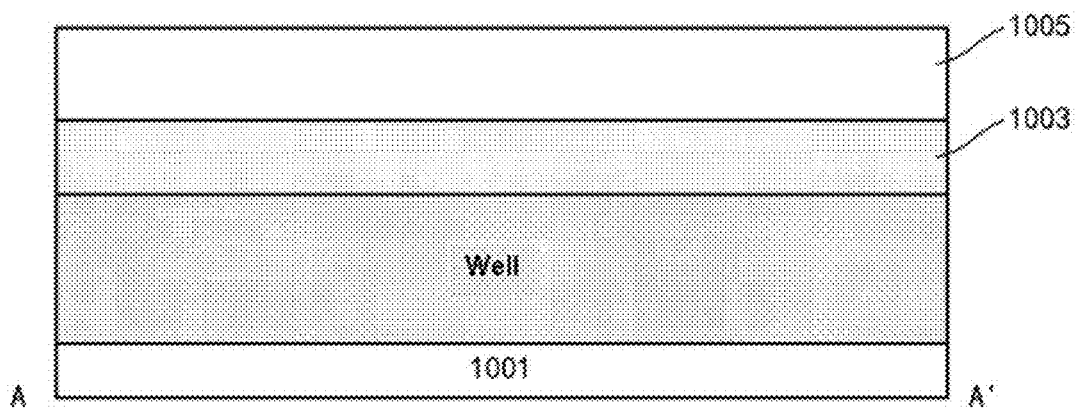
Figure 1C:
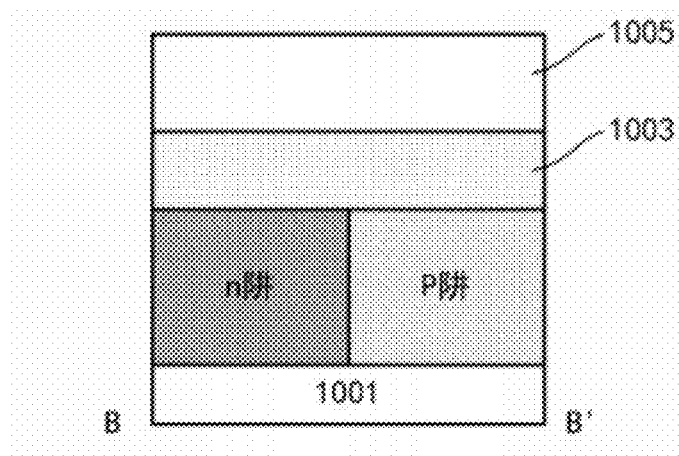

As shown in FIG. 1(*a*) to 1(*c*), a substrate 1001 is provided (the upper portion of which may form the above-mentioned first material layer). The substrate 1001 may be a substrate in various forms, including but not limited to a bulk semiconductor material substrate such as a bulk Si substrate, a semiconductor on insulator (SOI) substrate, a compound semiconductor substrate such as a SiGe substrate, and the like. In the following description, for convenience of description, a bulk Si substrate is taken as an example for description. Here, a silicon wafer is provided as the substrate 1001.

In the substrate 1001, a well region may be formed. If a p-type device is to be formed, the well region may be an n-type well; if an n-type device is to be formed, the well region may be a p-type well. The well region may be formed, for example, by implanting corresponding conductivity type dopants (p-type dopants such as B or In, or n-type dopants such as As or P) into the substrate 1001 and then performing thermal annealing. There are many ways to provide such a well region in the art, which will not be repeated here.

In this example, the p-type device and n-type device are formed at the same time as an example for description, and the p-type device and the n-type device are adjacent to each other (the complementary metal oxide semiconductor (CMOS) configuration may then be formed), thus forming adjacent n-type well and p-type well. However, the present disclosure is not limited to this. For example, devices of the same conductivity type may be formed. Alternatively, devices of different conductivity types may be formed, the p-type device is formed in a certain area and an n-type device is formed in another area.

In this example, the cut line AA' of the cross section is biased to a side of the p-type well, so that the substrate 1001 in the corresponding cross section contains the p-type well.

On the substrate 1001, the second material layer 1003 and the third material layer 1005 may be formed by, for example, epitaxial growth. The second material layer 1003 may be used to define the position of the gate stack, the thickness thereof is, for example, about 20 nm-50 nm. The third material layer 1005 may be used to define the position of the upper source/drain portion, and the thickness thereof is, for example, about 20 nm-200 nm.

The substrate 1001 and adjacent layers among the above-mentioned layers formed thereon may have etching selectivity with respect to each other. For example, in a case where the substrate 1001 is a silicon wafer, the second material layer 1003 may include SiGe (for example, the atomic percentage of Ge is about 10%-30%), and the third material layer 1005 may include Si.

Figure 2:
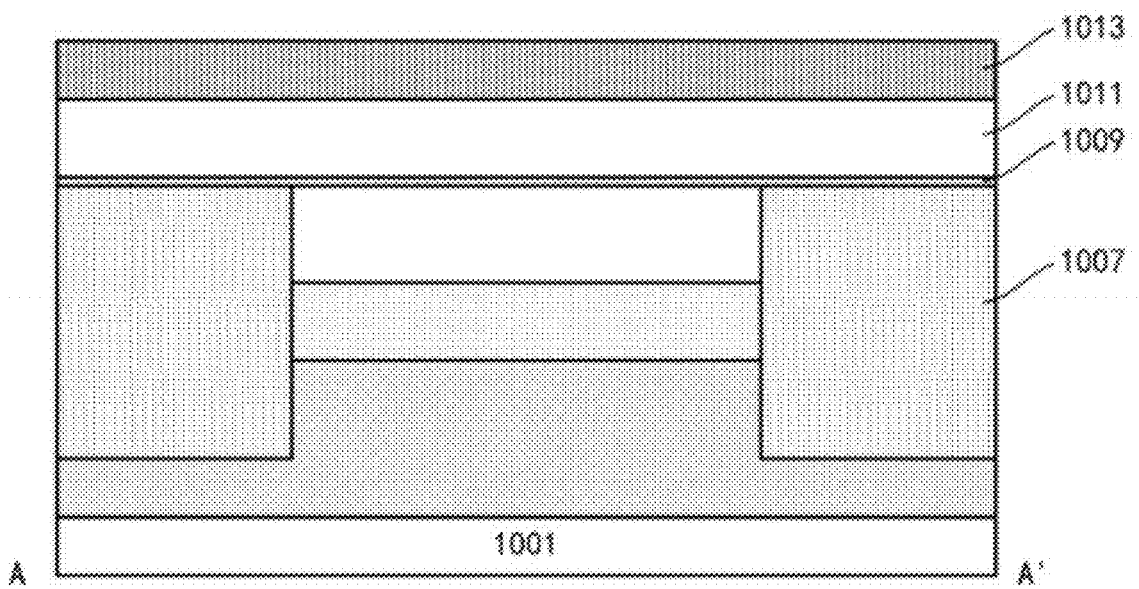

As shown in FIG. 2, in the substrate 1001, an active area may be defined by an isolation portion 1007, such as shallow trench isolation (STI). For example, the isolation portion 1007 may surround various active areas. Here, the isolation portion 1007 may pass through the second material layer 1003 and the third material layer 1005.

According to the embodiments, the spacer pattern transfer technology is used in the following patterning. To form the spacer, a mandrel may be formed. Specifically, a layer 1011 for a mandrel pattern may be formed on the third material layer 1005 by, for example, deposition. For example, the layer 1011 for the mandrel pattern may include amorphous silicon or polysilicon, with a thickness of about 50 nm-150 nm. In addition, for a better etching control, an etch stop layer 1009 may be formed first by, for example, deposition. For example, the etch stop layer 1009 may include oxide (for example, silicon oxide), the thickness of which is about 2 nm-10 nm.

On the layer 1011 for the mandrel pattern, a hard mask layer 1013 may be formed by, for example, deposition. For example, the hard mask layer 1013 may include nitride (for example, silicon nitride), the thickness of which is about 50 nm-100 nm.

The layer 1011 for the mandrel pattern may be patterned into a mandrel pattern.

Figure 3A:
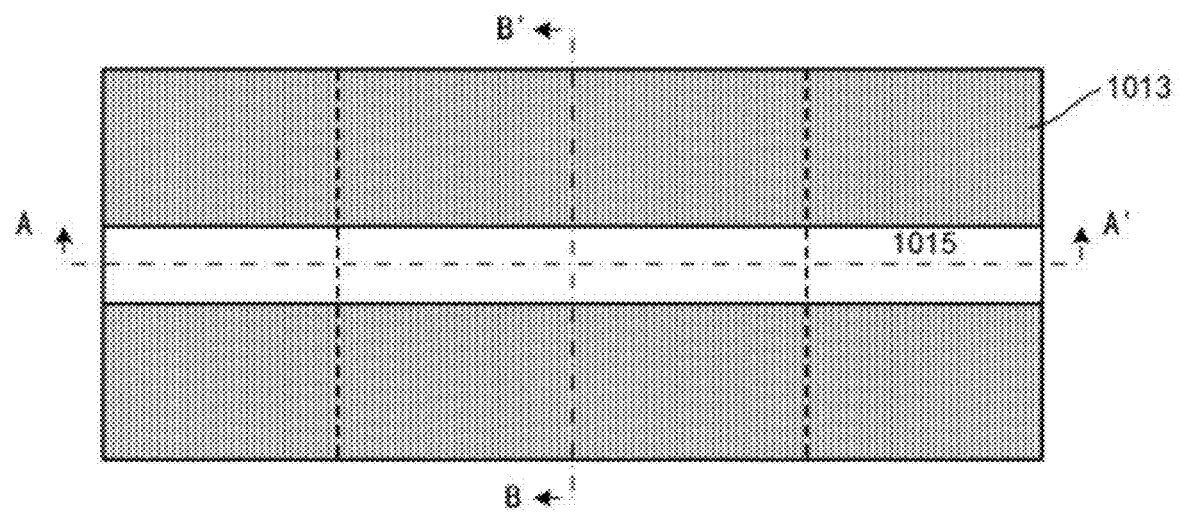
Figure 3B:
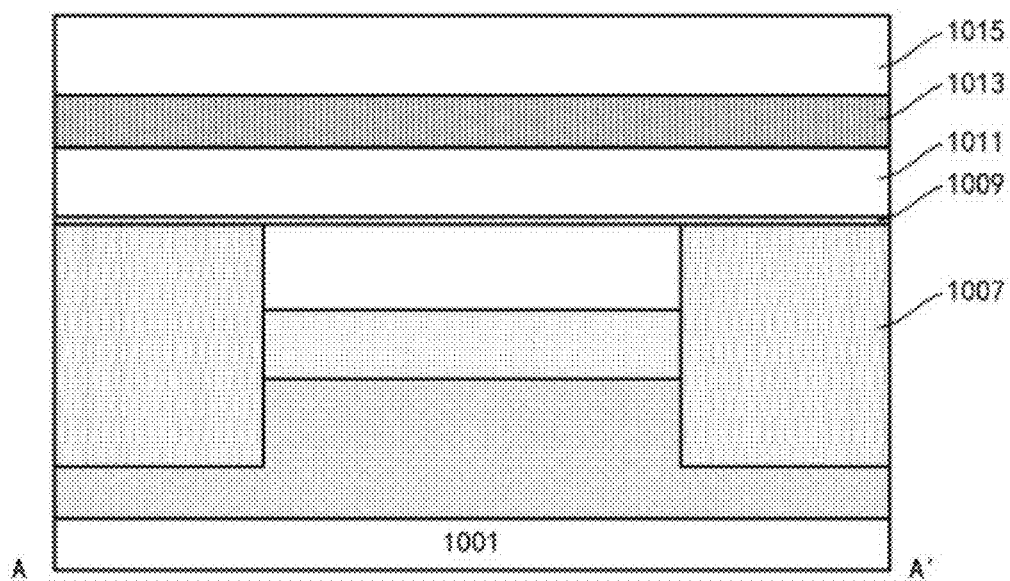
Figure 3C:
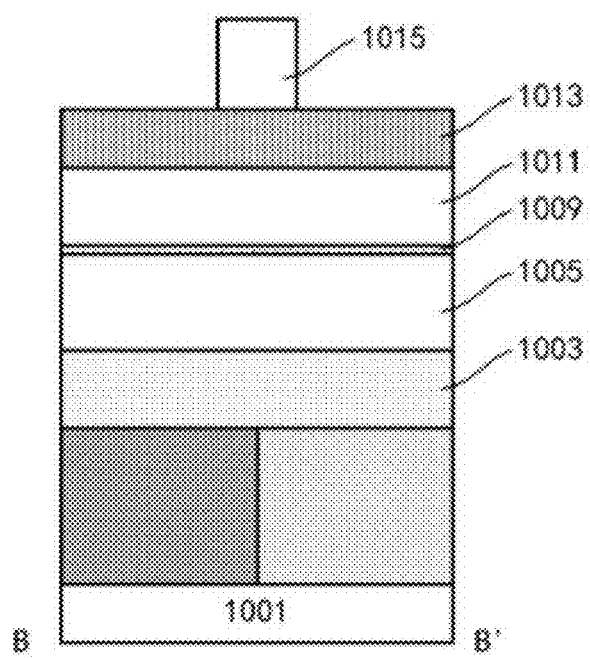

For example, as shown in FIGS. 3(*a*) and 3(*c*), a photoresist 1015 may be formed on the hard mask layer 1013, and patterned by photolithography to be a bar-like pattern extending along the first direction (the horizontal direction in FIG. 3(*a*)). Here, the bar-like pattern is shown as extending onto the isolation portion 1007.

Figure 4A:
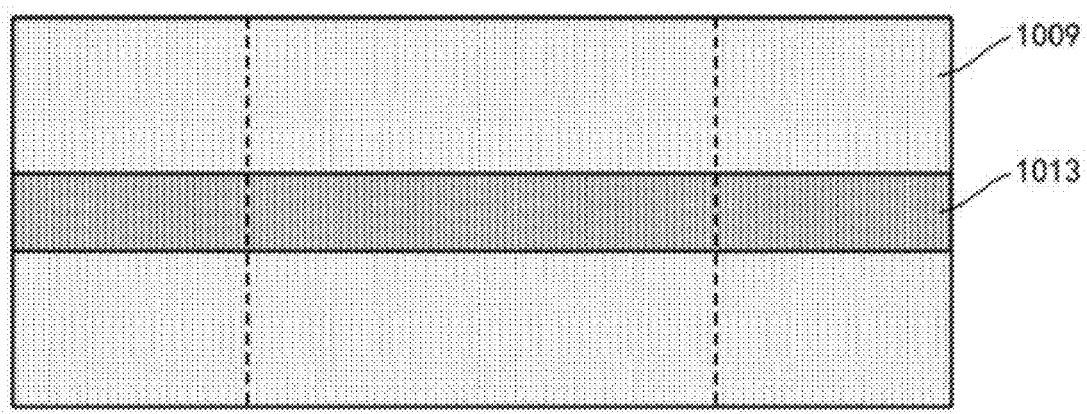
Figure 4B:
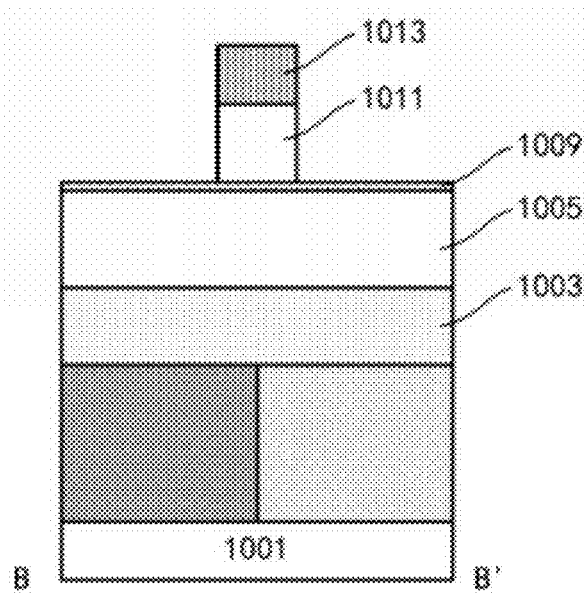

As shown in FIGS. 4(*a*) and 4(*b*), the photoresist 1015 may be used as an etching mask, and the hard mask layer 1013 and layer 1011 for the mandrel pattern are selectively etched in sequence by, for example, reactive ion etching (RIE), to transfer the photoresist pattern to the hard mask layer 1013 and the layer 1011 for the mandrel pattern. The etching may stop at the etch stop layer 1009. After that, the photoresist 1015 may be removed.

Figure 5A:
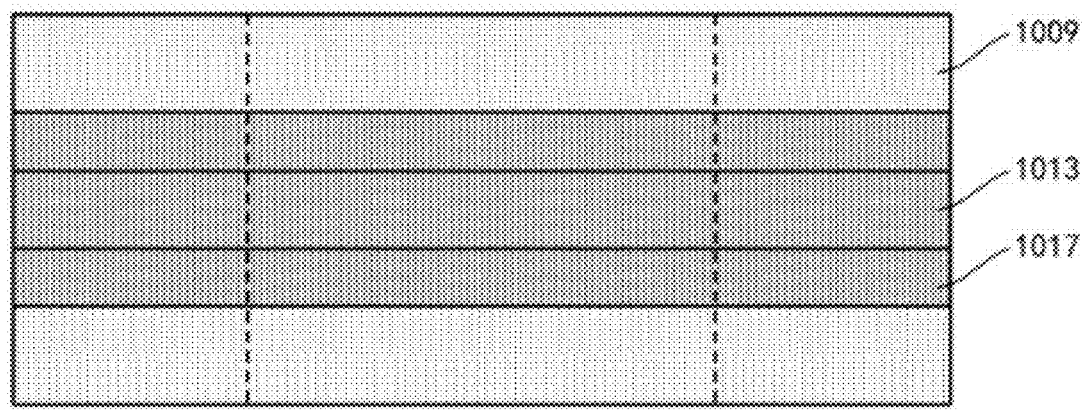
Figure 5B:
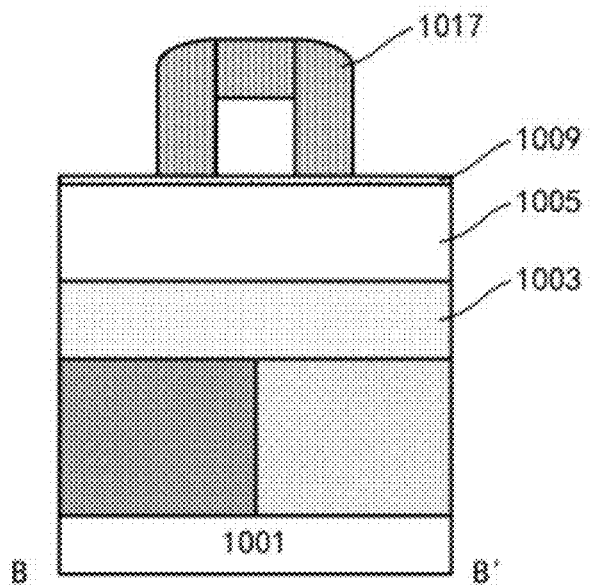

As shown in FIGS. 5(*a*) and 5(*b*), a spacer 1017 may be formed on the opposite sidewalls of the mandrel pattern 1011 in the second direction (the vertical direction in FIG. 5(*a*)) intersecting (for example, perpendicular to) the first direction. For example, a layer of nitride with a thickness of about 20 nm-50 nm may be deposited in a substantially conformal manner, and then the deposited nitride layer may be anisotropically etched, such as RIE (which may be stopped at the etch stop layer 1009) in the vertical direction, to remove the transversal extension portion and leave the vertical extension portion thereof, thereby obtaining the spacer 1017. The spacer 1017 may then be used to define the location of the active area of the device.

Figure 6:
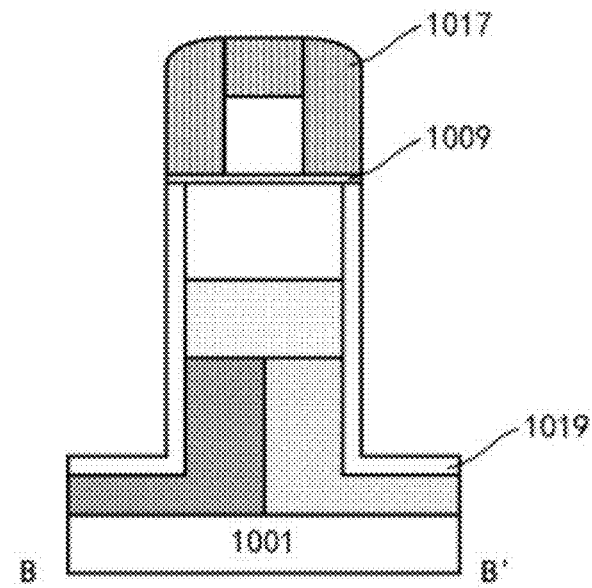

As shown in FIG. 6, the hard mask layer 1013 and the spacer 1017 may be used to pattern the third material layer 1005, the second material layer 1003 and the upper portion of the substrate 1001 (first material layer) into a ridge-like structure. For example, the hard mask layer 1013 and the spacer 1017 may be used as an etching mask, and each layer is selectively etched in sequence by, for example, RIE, to transfer the pattern to the lower layer. The etching may enter the well region of the substrate 1001. Thus, between the isolation portions 1007, the upper portion of the substrate 1001, the second material layer 1003 and the third material layer 1005 may form the ridge-like structure extending in the first direction.

The first active layer may be formed on the sidewall of the ridge-like structure so as to subsequently define the channel portion. For the convenience of the following patterning, the portion of the first active layer serving as the channel portion may be formed under the spacer 1017 (which may minimize a protective layer provided for the channel portion in the following patterning). For example, the ridge-like structure may be etched back so that its outer peripheral sidewall is recessed transversely with respect to the outer peripheral sidewall of the spacer 1017. To control the etching depth, atomic layer etching (ALE) may be used. Then, the first active layer 1019 may be formed on the sidewall of the ridge-like structure by, for example, selective epitaxial growth. Due to the selective epitaxial growth, the first active layer 1019 may be formed on the vertical sidewall of the ridge-like structure and the surface of the substrate 1001. The first active layer 1019 may then define the channel portion, its thickness is, for example, about 3 nm-15 nm According to the embodiments of the present disclosure, the thickness of the first active layer 1019 (which is then used as the channel portion) may be determined by an epitaxial growth process, and thus the thickness of the channel portion may be better controlled.

On the opposite sides of the ridge-like structure, the first active layer 1019 may respectively form a L shape extending along the corresponding sidewall under the spacer 1017.

In FIG. 6, the sidewall of the portion of the first active layer 1019 on the vertical sidewall of the ridge-like structure is shown to be substantially flush with the sidewall of the spacer 1017. This may be achieved by controlling the amount of etch-back and the epitaxial growth thickness to be substantially the same. However, the present disclosure is not limited to this. For example, the sidewall of the portion of the first active layer 1019 on the vertical sidewall of the ridge-like structure may be recessed relative to the sidewall of the spacer 1017, or may even protrude.

Due to this epitaxial growth, the material of the first active layer 1019 may be appropriately selected according to the performance requirements of the design on the device. For example, the first active layer 1019 may include various semiconductor materials, such as Si, Ge, SiGe, GaAs, InGaAs, and so on.

In the example of FIG. 6, the first active layer 1019 on the opposite sides of the isolation portion 1007 may have substantially the same characteristics (for example, materials, dimensions, etc.). However, the present disclosure is not limited to this. As stated below, two devices opposite to each other may be formed by a single ridge-like structure. For example, according to design on performance requirements for two devices, the first active layer 1019 on the opposite sides of the isolation portion 1007 may have different characteristics, such as different thickness and/or material. In addition, for a p-type device, the first active layer may include Si, SiGe, Ge, etc.; for a n-type device, the first active layer may include Si, InGaAs, InP or other III-V compound semiconductors, etc.

Figure 7:
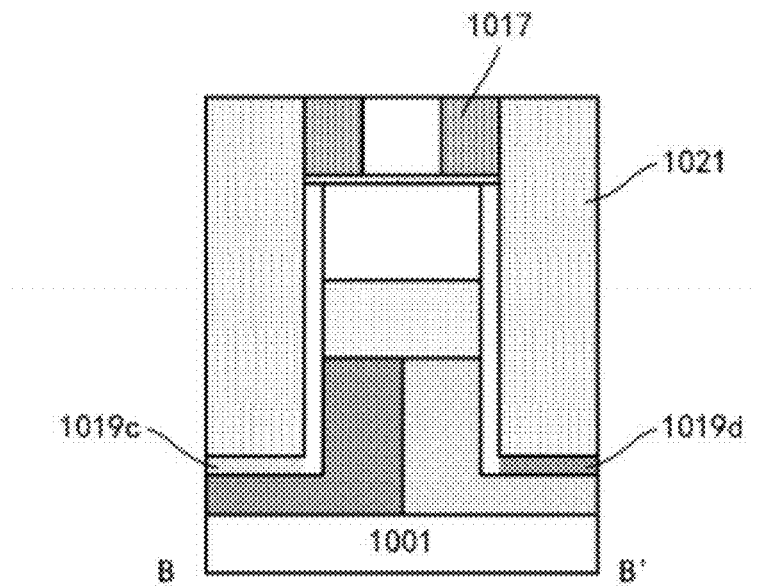

In order to facilitate manufacturing subsequent electrical contact to the lower source/drain portion, a contact area may be formed in the transversely extending portion of the first active layer 1019. For example, ion implantation may be used to implant dopants into the transversely extending portion of the first active layer 1019. The conductivity type of the dopant may be the same as the conductivity type of the lower end contact formed later. For example, for a p-type device, p-type dopants such as B, BF2 or In may be implanted with a concentration of about $1E19\text{-}1E21\ cm^{-3}$; for a n-type device, n-type dopants such as P or As may be implanted with a concentration of approximately $1E19\text{-}1E21\ cm^{-3}$. The two types of doping can be performed separately. The transversely extending portion of the first active layer 1019 containing the dopant (which may be activated by a subsequent annealing process) may form a contact area 1019c for the p-type device and a contact area 1019d for the n-type device, as shown in FIG. 7. Due to the existence of the spacer 1017, ion implantation may not substantially affect the vertical portion of the first active layer 1019 (the channel portion is subsequently formed).

In order to further reduce the contact resistance, silicide may also be formed on the transversely extending portion of the first active layer 1019. For example, a shielding layer (for example, oxynitride in the form of a spacer) may be used to shield the transversely extending portion of the first active layer 1019, and then metal such as NiPt, Co, Ni, Ti, etc. is deposited on the transversely extending portion of the first active layer 1019, and an annealing process is performed to make the metal react with the transversely extending portion of the first active layer 1019, thereby generating silicide. After that, unreacted metal may be removed, and the shielding layer may be removed.

As shown in FIG. 7, an isolation layer 1021 may be formed around the ridge-like structure on the sidewall of which the first active layer 1019 is formed. For example, an oxide layer that completely covers the ridge-like structure may be formed on the substrate 1001 by deposition, and the planarization processing such as chemical mechanical polishing (CMP) (CMP may stop at the mandrel pattern 1011) may be performed to the deposited oxide layer to form the isolation layer 1021, the isolation layer 1021 and the previous isolation layer 1007 surround the periphery of the ridge-like structure together.

Figure 8A:
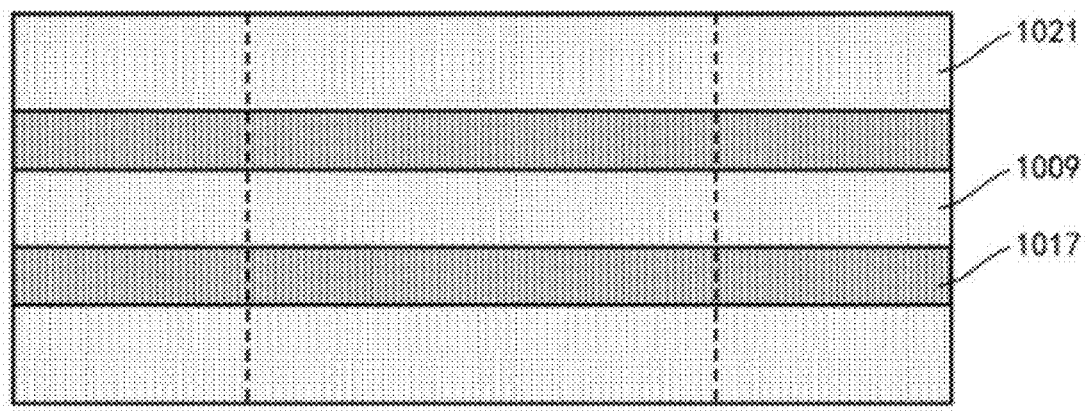
Figure 8B:
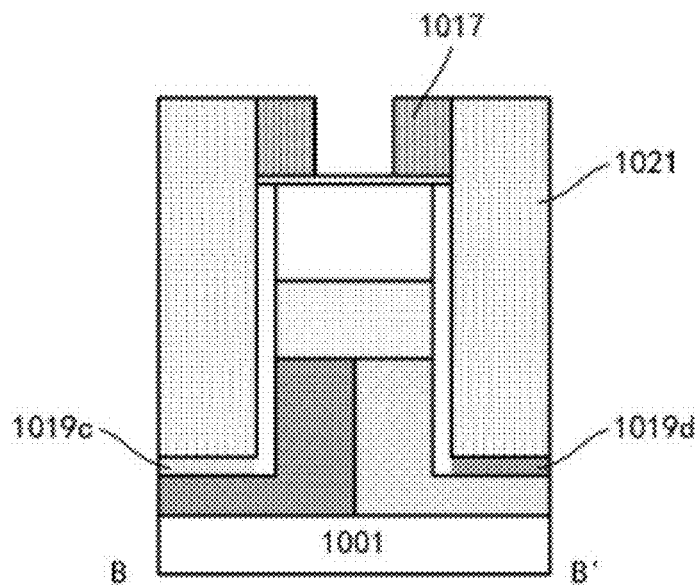

As shown in FIGS. 8(a) and 8(b), the mandrel pattern 1011 may be removed by selective etching such as wet etching using TMAH solution or dry etching using RIE. In this way, a pair of spacers 1017 opposite to each other are left on the ridge-like structure.

Figure 9A:
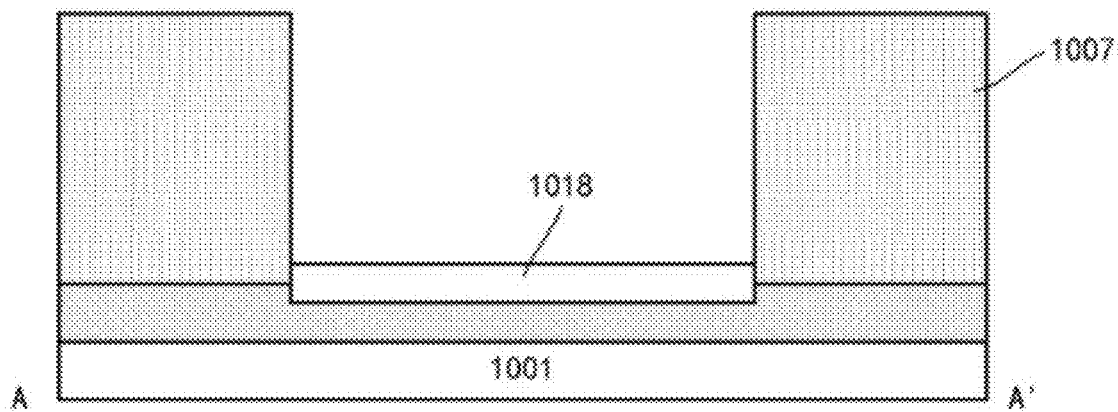
Figure 9B:
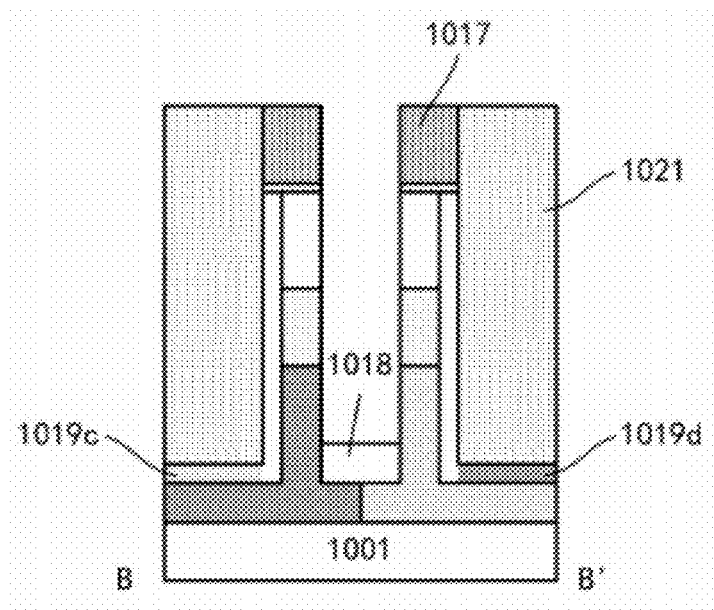

As shown in FIGS. 9(a) and 9(b), the spacer 1017 may be used as an etching mask, and the etch stop layer 1009, the third material layer 1005, the second material layer 1003 and the upper portion of the substrate 1001 may be selectively etched in sequence, for example by RIE. The etching may be performed into the well region of the substrate 1001. In this way, in the space surrounded by the isolation portion 1007, 1021, the third material layer 1005, the second material layer 1003, and the upper portion of the substrate 1001 form a pair of stacks with bar-shaped patterns corresponding to the spacer 1017 to define the active areas.

Of course, the formation of the bar-shaped stack for defining the active area is not limited to the spacer pattern transfer technology, and may also be performed by photolithography using photoresist or the like.

In addition, for isolation between the p-type device and the n-type device, an isolation portion 1018 may be formed on the inner side of the spacer 1017. For example, the isolation portion 1018 may be formed by filling the space on the inner side of the spacer 1017 with oxynitride and performing etching back such as RIE on the deposited oxynitride.

Here, for the purpose of epitaxial growth, the second material layer 1003 used to define the gate stack position includes a semiconductor material, which is inconvenient in the following processing of the source/drain portion. For this, the second material layer 1003 may be replaced with a dielectric material to form a dummy gate to facilitate subsequent processing of the source/drain portion.

Figure 10:
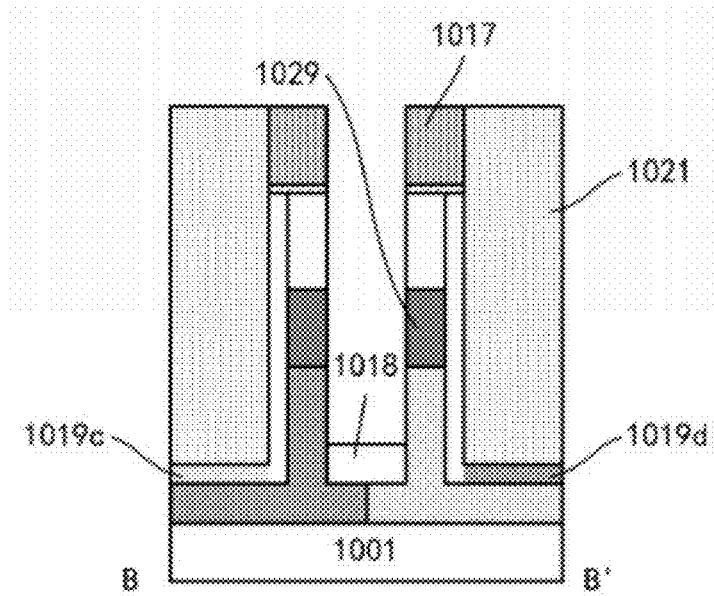

For example, as shown in FIG. 10, the second material layer 1003 (SiGe in this example) may be removed by selectively etching relative to the first active layer 1019, the substrate 1001, and the third material layer 1005 (all of them are Si in this example). Then, a dummy gate 1029 may be formed in the space left under the spacer 1017 due to the removal of the second material layer 1003. The dummy gate 1029 may be formed by deposition and then etching back. For example, the dummy gate 1029 may include a material such as SiC, having etching selectivity with respect to the first material layer, the third material layer, and the first active layer.

After that, the source/drain portion may be formed. According to the embodiments of the present disclosure, for a p-type device and a n-type device, source/drain portions of different materials may be formed. Therefore, the source/drain portions may be formed separately for the p-type device and the n-type device. When forming the source/ drain portion of one type of device, a shielding layer may be used to shield another type of device. The processing sequence of the two types of devices may be exchanged.

Figure 11:
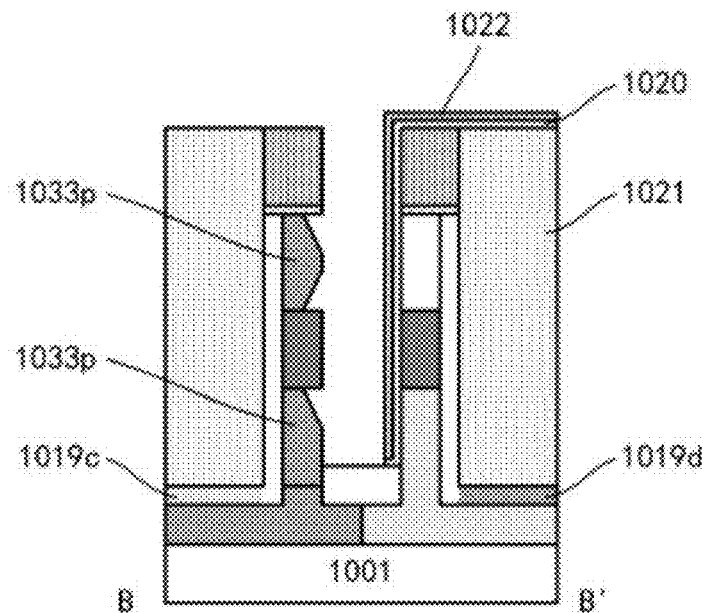

For example, as shown in FIG. 11, a shielding layer 1022 such as nitride may be used to shield the n-type device area. In order to better control the etching, an etch stop layer 1020 such as oxide may be formed first. For the exposed p-type device area, the first material layer and the third material layer may be at least partially etched back through selective etching. The etching back may be carried out to the first active layer or into the first active layer, but it is preferable to leave a certain thickness of the semiconductor layer (the first material layer, the third material layer, or the first material layer) on the upper and lower sides of the dummy gate, to serve as a seed layer for subsequent epitaxial growth. After that, the second active layer 1033p for the p-type device may be formed on the upper and lower sides of the dummy gate by selective epitaxial growth. The second active layer 1033p may be doped in situ (for example, doped to be p-type) during growth. After that, the etch stop layer 1020 and the shielding layer 1022 may be removed.

Figure 12:
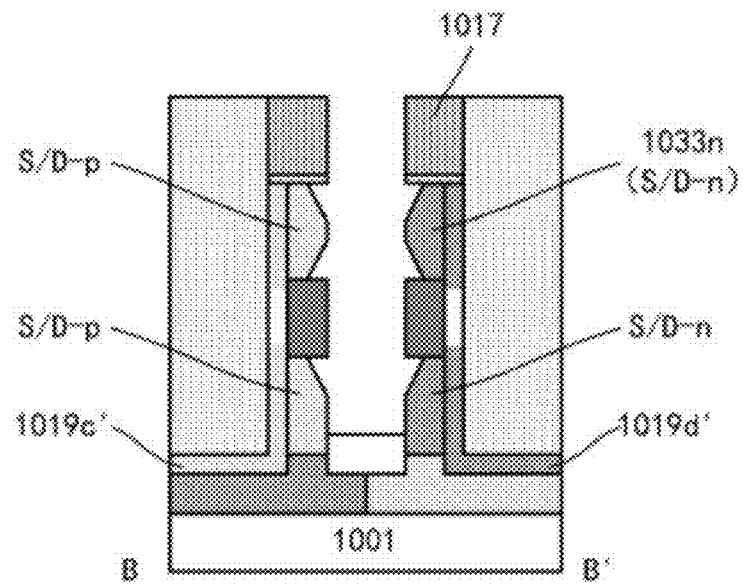

Then, as shown in FIG. 12, the n-type device area may be similarly processed to form the second active layer 1033n for the n-type device.

In addition, an annealing treatment may be performed to activate the dopants to form a source/drain portion S/D-p for the p-type device and a source/drain portion S/D-n for the n-type device. In the source/drain portions S/D-p and S/D-n, the concentration of the dopants may be about 1E19-1E21 cm$^{-3}$. The annealing treatment may make doped profiles on the inner and outer sides of the spacer 1017 contact, shown as 1019c' and 1019d', respectively.

According to the embodiments, the dopants may also be driven into the first active layer 1019, and preferably into the end portion of the portion (defining the channel portion) of the first active layer 1019 covered by the dummy gate 1023, therefore the doped profile of the source/drain portion may have some overlap with the dummy gate 1023 (and the gate stack formed later), which facilitates reducing the external resistance.

In this example, the dummy gate may be used as a mask when the first material layer and the third material layer are etched back. Therefore, the etching back may be performed along the upper and lower surfaces of the dummy gate, and the second active layers 1033p and 1033n may grow along the upper and lower surfaces of the dummy gate. Therefore, the extent to which the dopants in the second active layers 1033p and 1033n are driven into the first active layer (more specifically, the portion of the first active layer covered by the dummy gate) at the upper and lower surfaces of the dummy gate may be substantially the same. More specifically, the distance between the doped interface between the upper source/drain portion S/D-p, S/D-n and the channel portion and the upper surface of the dummy gate may be substantially equal to the distance between the doped interface between the lower source/drain portion S/D-p, S/D-n and the channel portion and the lower surface of the dummy gate. The distance may be about 2 nm-10 nm, for example. In addition, the distance may be kept substantially constant in the longitudinal extension direction (the first direction) of the dummy gate. In addition, the distance may be substantially the same under each spacer 1017. Therefore, the interface between the source/drain portion S/D-p and the channel portion in the p-type device area and the interface between the source/drain portion S/D-n and the channel portion in the n-type device area may be substantially coplanar.

Here, the material of the second active layer may be selected, for example, to be a semiconductor material having a different lattice constant from the first active layer, so as to apply stress to the channel portion formed in the first active layer to enhance device performance. For example, for a p-type device, the second active layer 1033p may include SiGe (the atomic percentage of Ge is, for example, about 0-75%), when the atomic percentage of Ge is greater than 0, compressive stress may be applied to the channel portion; for a n-type device, the second active layer 1033n may include Si:C (the atomic percentage of C is, for example, about 0-3%), when the atomic percentage of C is greater than 0, tensile stress may be applied to the channel portion.

In addition, the grown second active layer 1033 may have a shape that tapers toward an inner side in a cross-sectional view, such as a substantially trapezoidal shape, which facilitates reducing the capacitance between the source/drain portion and the gate stack.

In this example, the source/drain portion S/D is formed by a second active layer that is additionally epitaxially grown. However, the present disclosure is not limited to this. For example, the source/drain S/D may be formed directly based on the first material layer and the third material layer.

For example, a solid phase dopant source layer may be formed on the inner side of the spacer 1017 by deposition. For example, the solid phase dopant source layer may be an oxide containing dopants. The dopants contained in the solid phase dopant source layer may be used to dope the source/drain portion, and thus may have the same conductivity type as the source/drain portion to be formed. For example, for a p-type device, the solid-phase dopant source layer may include p-type dopants such as B or In; for an n-type device, the solid-phase dopant source layer may include n-type dopants such as P or As. The concentration of the dopants of the solid phase dopant source layer may be about 0.01%-5%. The dopants in the solid-phase dopant source layer may be driven into the first material layer and the third material layer through an annealing treatment to form the source/drain portion S/D. Likewise, dopants may be driven into the first active layer, so that the doped profile of the source/drain portion S/D may have some overlap with the dummy gate 1023 (and the gate stack formed later). After that, the solid phase dopant source layer may be removed.

In this example, the first material layer is provided through the upper portion of the substrate 1001. However, the present disclosure is not limited to this. For example, the first material layer may also be an epitaxial layer on the substrate 1001. In this case, the first material layer and the third material layer may be doped in-situ during epitaxial growth, instead of using a solid-phase dopant source layer for doping.

Next, a replacement gate process may be performed to replace the dummy gate with the gate stack.

Figure 13A:
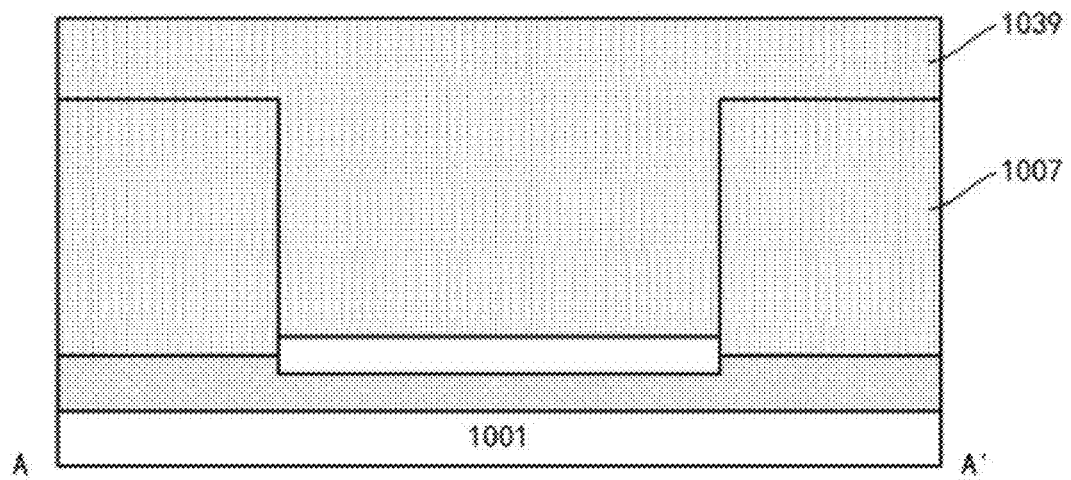
Figure 13B:
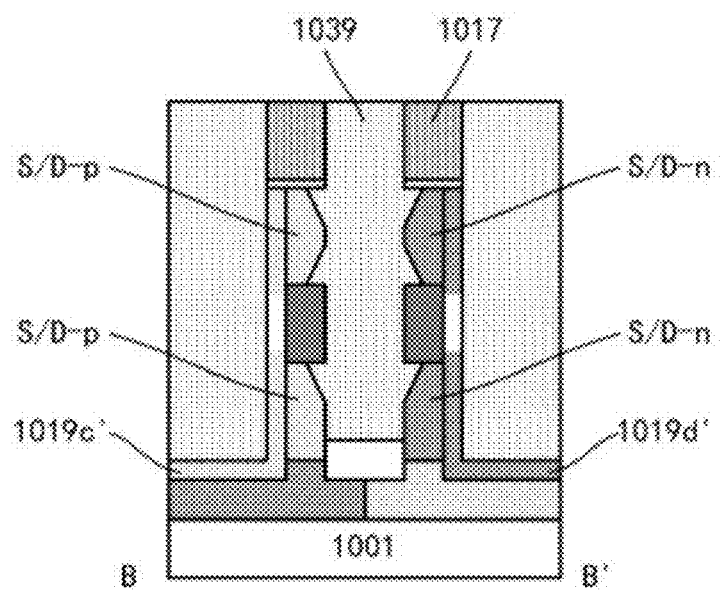

As shown in FIGS. 13(a) and 13(b), an isolation layer 1039 may be formed on the inner side of the spacer 1017. For example, a dielectric material such as oxide may be deposited to completely fill the space on the inner side of the spacer 1017. Then, the planarization processing such as CMP may be performed to deposited dielectric material, and the CMP may be stopped at the spacer 1017 to form the isolation layer 1039.

Here, the gate stack is then formed on the inner side of the spacer 1017, the space on the inner side of the spacer 1017 is a relatively small. In order to facilitate the production of the contact portion to the gate stack, the space on the inner side of the spacer 1017 may be increased. For example, the space on the inner side of the spacer 1017 on the isolation layer 1007 may be increased, and the spacer 1017 on the active area may be kept almost stationary to protect the active area. Subsequently, the landing pad of the gate contact portion may be formed in such an enlarged space.

Figure 14A:
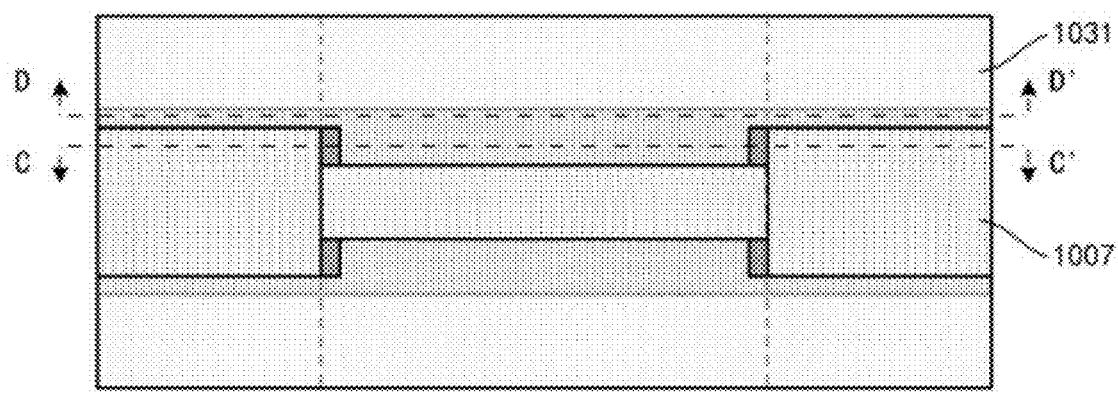
Figure 14B:
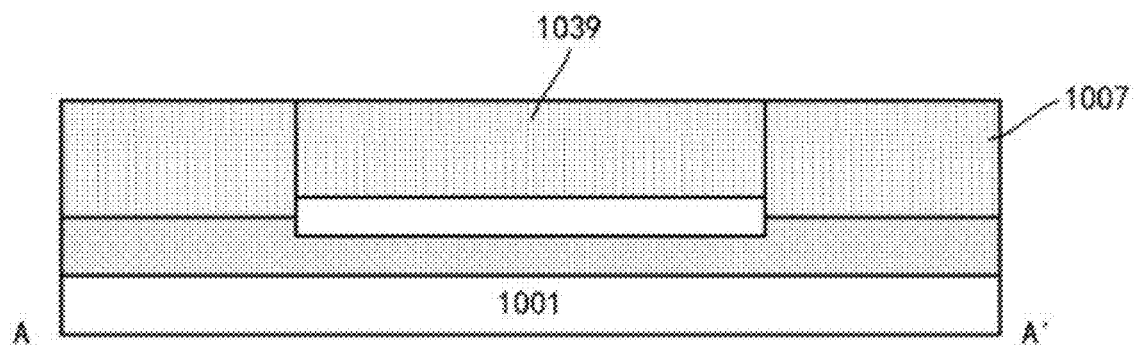
Figure 14C:
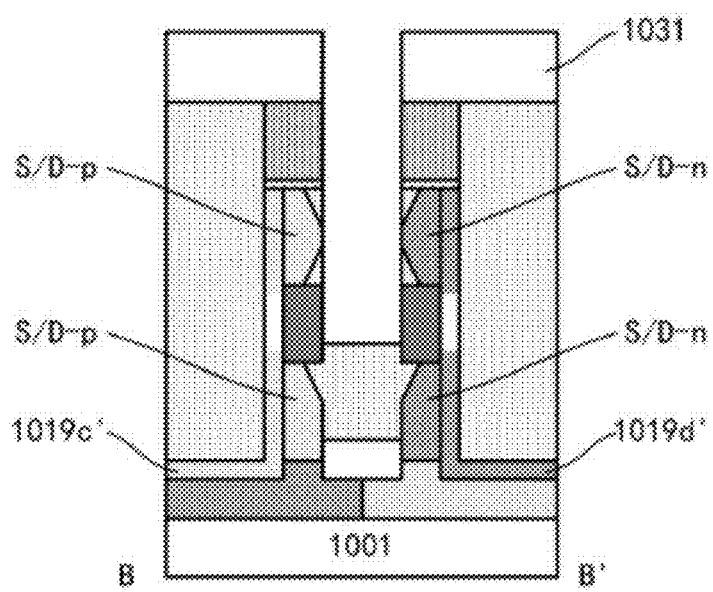
Figure 14D:
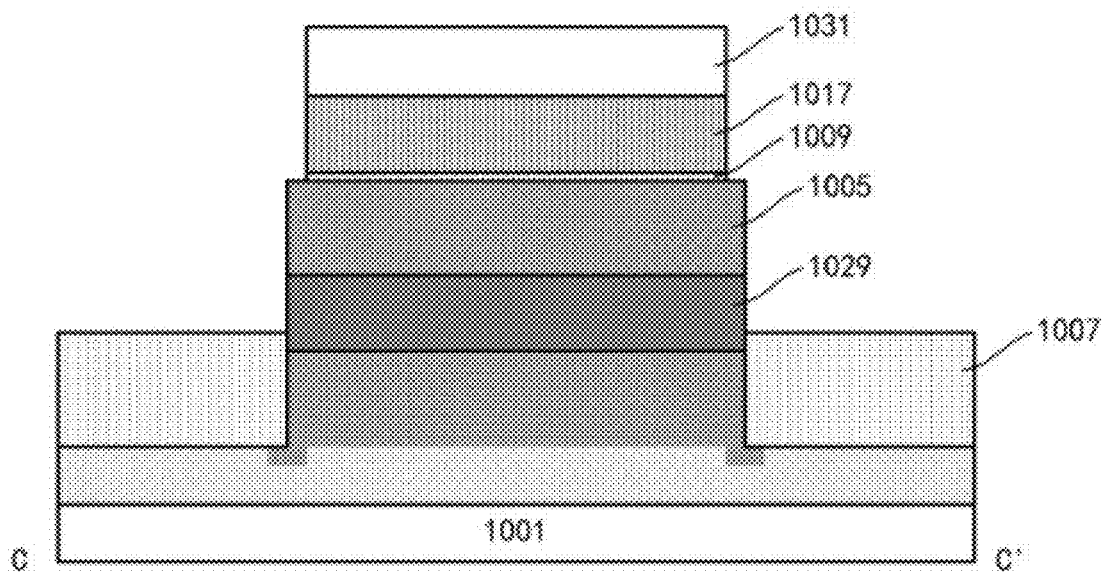
FIG. 14(d), 16(c), 18(c), 19(c), 20(b), 21(b), 22(c) are cross-sectional views along CC' line.
Figure 14E:
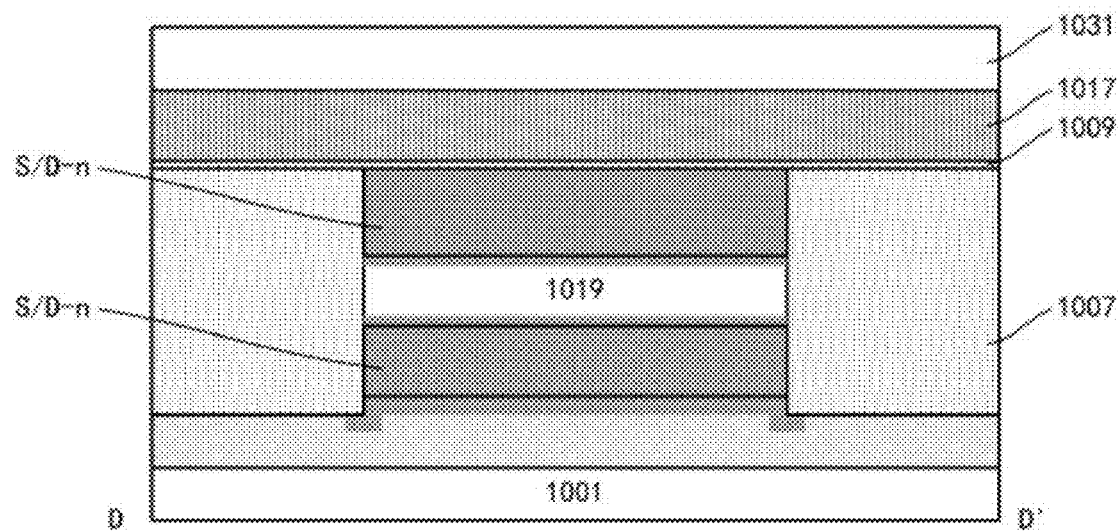
FIG. 14(e) is a cross-sectional view along DD' line.

As shown in FIGS. 14(a) to 14(e), a photoresist 1031 may be formed, and the photoresist 1031 may be patterned to expose a large area on opposite sides of the bar-shaped active area in the first direction (the left and right sides in FIG. 14(a)), especially expose the inner portion of the spacer 1017 on the isolation layer 1007, and the space on the inner side of the spacer 1017 is exposed on the bar-shaped active area. In addition, at the opposite ends of the bar-shaped active area in the first direction, a portion of the spacer 1017 may be exposed, so that the gate stack may then extend from here to the isolation layer 1007 on both sides. Noted that the gate stack may also extend from between the spacers 1017 on the active area to the isolation layers 1007 on both sides, but the additional extension from the above opposite two ends may reduce the resistance.

Here, the space exposed by the photoresist 1031 may not exceed the spacer 1017 (that is, the spacer 1017 on the isolation layer 1007 will not be completely removed, but a portion of the outer side thereof may be left), so that the gate stack formed subsequently may be left on the inner side of the spacer 1017.

The photoresist 1031 may be used as a mask to selectively etch the spacer 1017 such as RIE. In this way, as shown in the top view of FIG. 14(a), the space on the inner side of the spacer 1017 increases on opposite sides in the first direction. In addition, as shown in the cross-sectional view of FIG. 14(d), at both ends of the active area, a portion of the sidewall of the dummy gate 1029 is exposed, which will cause the gate stack to extend onto the isolation layer 1007 on both sides in the subsequent replacement gate process.

The isolation layers 1007, 1039 on the inner side of the spacer 1017 may be etched back such as RIE, leaving a certain thickness of the isolation layers 1007, 1039 at the bottom of the space on the inner side of the spacer 1017. The isolation layers 1007 and 1039 may shield the lower source/drain portion, for example, the top surface thereof is (slightly) higher than the bottom surface of the dummy gate, but the sidewall of the dummy gate are fully exposed for subsequent removal of the dummy gate and filling the gate stack. After that, the photoresist 1031 may be removed.

Figure 15:
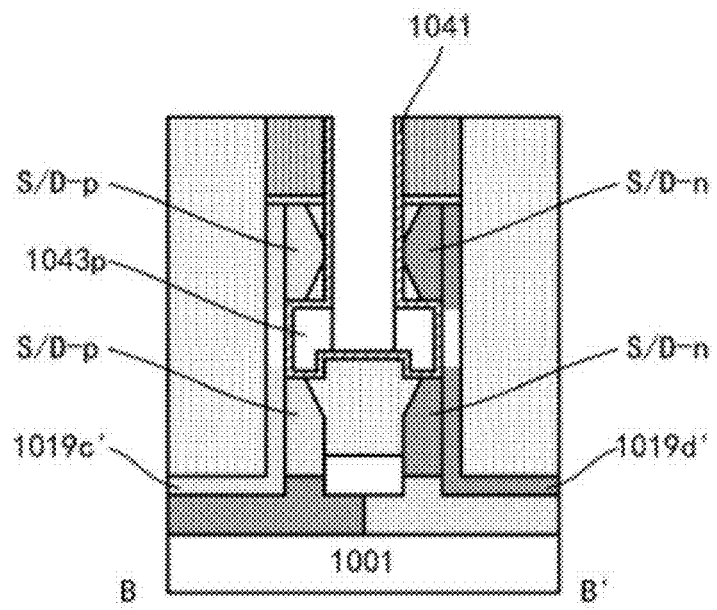

Then, as shown in FIG. 15, the dummy gate may be removed by selective etching, and the gate stack may be formed on the inner side of the spacer 1017. For example, the gate dielectric layer 1041 may be formed in a substantially conformal manner by deposition, and the remaining space may be filled with the gate conductor layer 1043p for the p-type device. The planarization processing such as CMP may be performed to the filled gate conductor layer 1043p, and the CMP may be stopped at the spacer 1017. Then, the gate conductor layer 1043p may be etched back, and the etching back may stop at the gate dielectric layer 1041. In this way, the gate conductor layer 1041p remains in the space left under the spacer 1017 due to the removal of the dummy gate.

Then, as shown in FIGS. 16(a) to 16(d), a shielding layer (not shown) may be used to shield the p-type device area, expose the n-type device area, and the gate conductor layer 1043p in the n-type device area is removed by selective etching. After that, the space on the inner side of the spacer 1017 may be filled with the gate conductor layer 1043n for the n-type device. The planarization processing such as CMP may be performed to the filled gate conductor layer 1043n, and the CMP may stop at the spacer 1017. Then, the gate conductor layer 1043n may be etched back to make its top surface lower than the top surface of the previous dummy gate to reduce the capacitance between the source/drain portion and the gate stack.

Figure 16A:
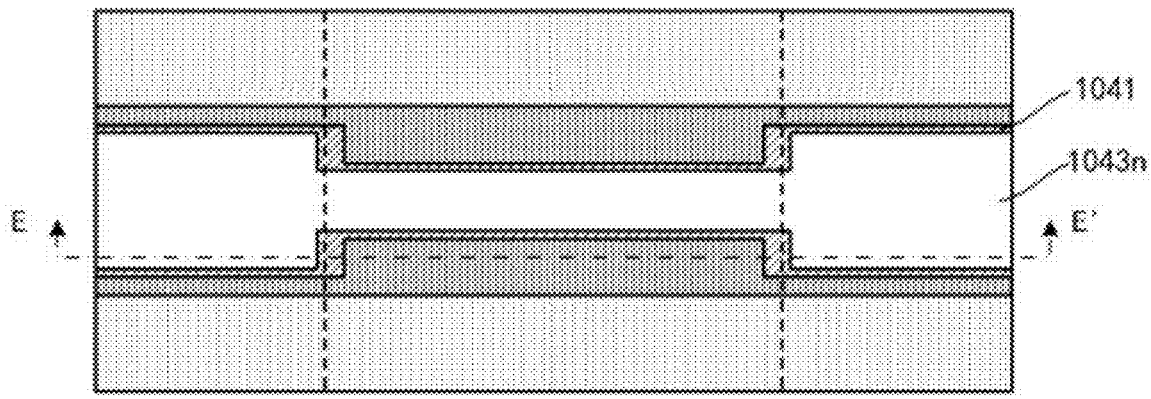
Figure 16B:
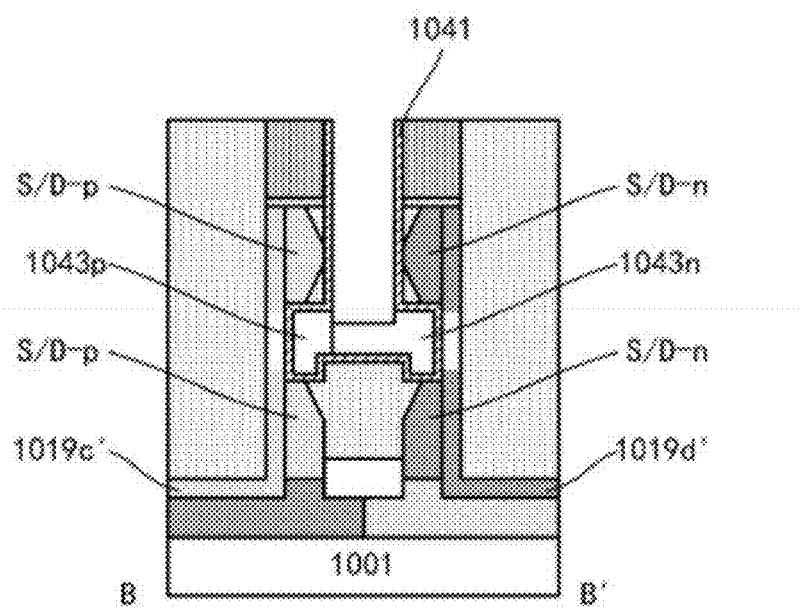
Figure 16C:
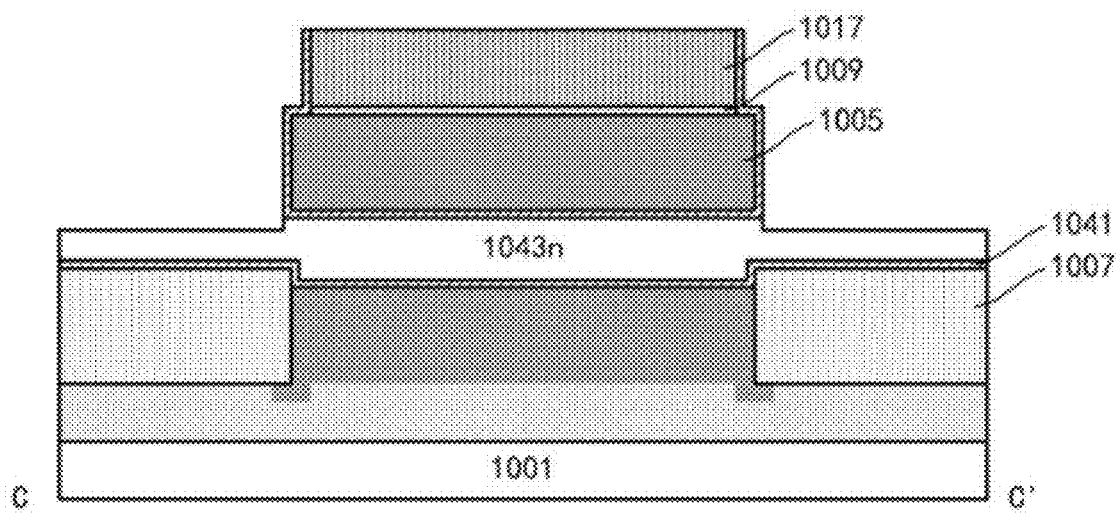
Figure 16D:
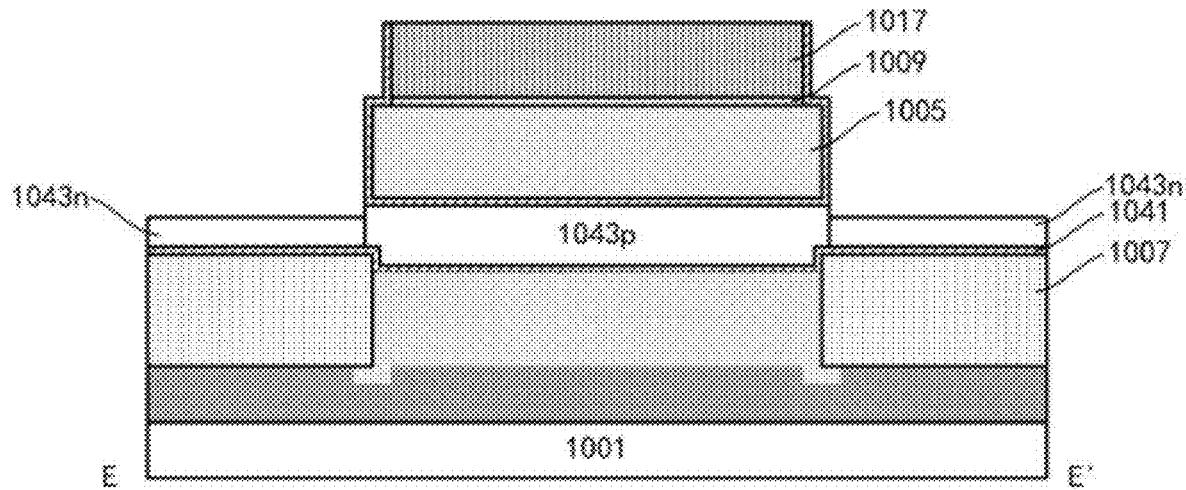

As shown in FIG. 16(a), the gate conductor layer 1043n may be located on the isolation layers 1007, 1039 and cover almost the entire space on the inner side of the spacer 1017. In addition, as shown in FIG. 16(b), the gate conductor layer 1043n may extend to contact portion and thus be electrically connected to the gate conductor layer 1043p.

For example, the gate dielectric layer 1041 may include a high-k gate dielectric such as HfO2, and the thickness is, for example, about 1 nm-5 nm. Before forming the high-k gate dielectric, an interface layer may also be formed as, for example, an oxide formed by an oxidation process or deposition such as atomic layer deposition (ALD), with a thickness of about 0.3 nm-1.5 nm. The gate conductor layer 1043p is used for a p-type device, and may include a work function adjusting metal such as TiN, TaN, etc. and a gate conductive metal such as W, etc. Similarly, the gate conductor layer 1043n may include a work function adjusting metal such as TiN, TaN, TiAlC, etc., and a gate conductive metal such as W, etc.

In this example, the p-type device and the n-type device have the same gate dielectric layer 1041. However, the present disclosure is not limited to this. For example, the p-type device and the n-type device may have different gate dielectric layers. When using different materials for different types of devices, they may be treated, separately. As described above, when processing one type of device, a shielding layer may be used to shield the area where another type of device is located. The processing sequence may be exchanged.

Figure 17A:
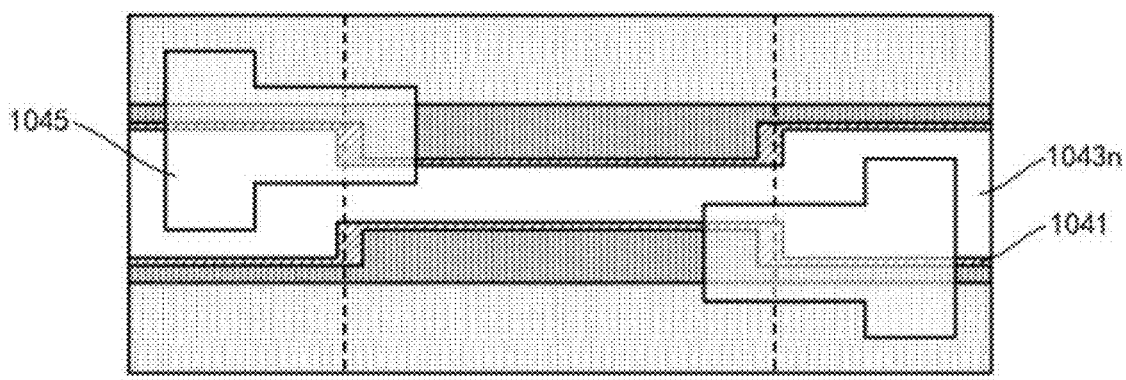

According to the device design, the gate conductor layer 1043n may be disconnected between the two devices by, for example, photolithography, at the same time, the landing pad of the gate contact portion may also be patterned. As shown in FIG. 17(a), the photoresist 1045 may be formed and patterned to cover the area where the landing pad of the gate contact portion is to be formed, and expose other areas.

Figure 17B:
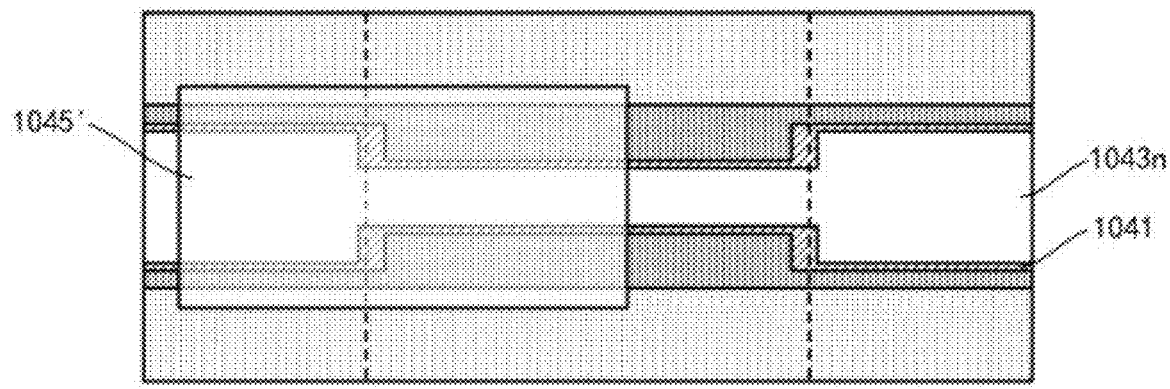

According to other embodiments, the gate conductor layer 1043n between the two devices may remain connected together. As shown in FIG. 17(b), the photoresist 1045' may be formed and patterned to cover the continuous area between the two devices and cover the area where the landing pad of the gate contact portion is to be formed, and expose other areas.

Then, as shown in FIGS. 18(a) to 18(d), the photoresist 1045 (and the spacer 1017) may be used as a mask to selectively etch the gate conductor layer 1043n such as RIE, the RIE may stop at the gate dielectric layer 1041.

Figure 18A:
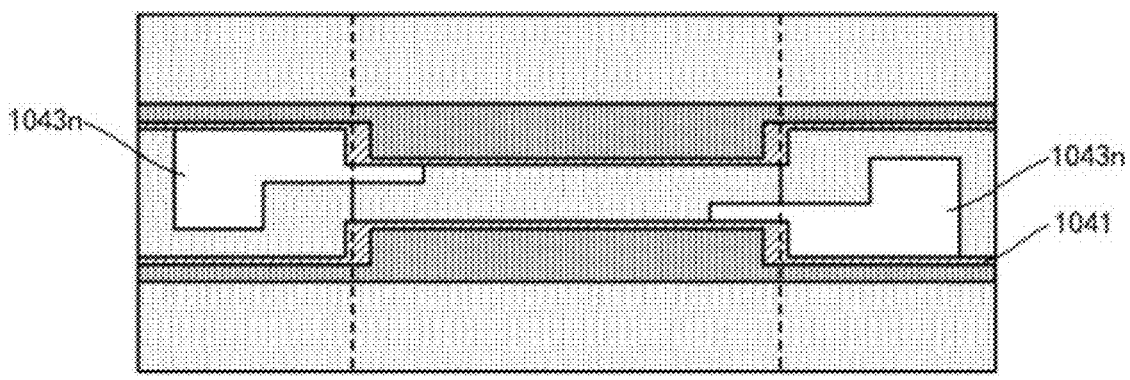
Figure 18B:
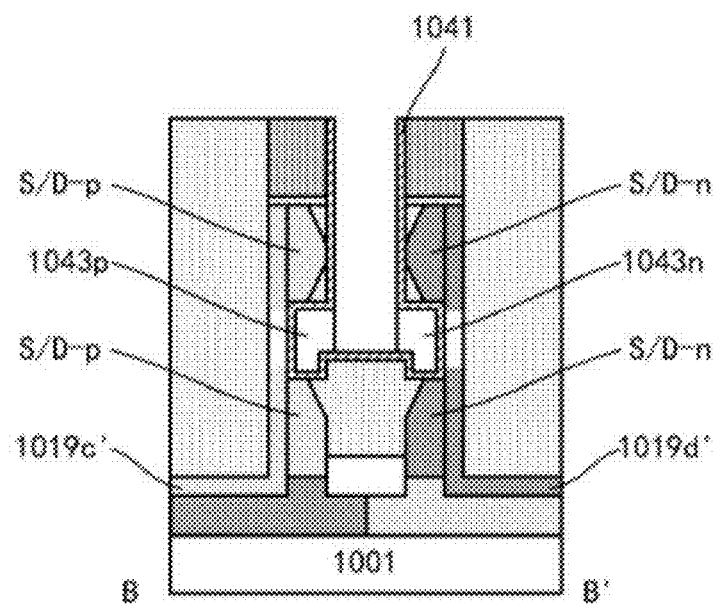
Figure 18C:
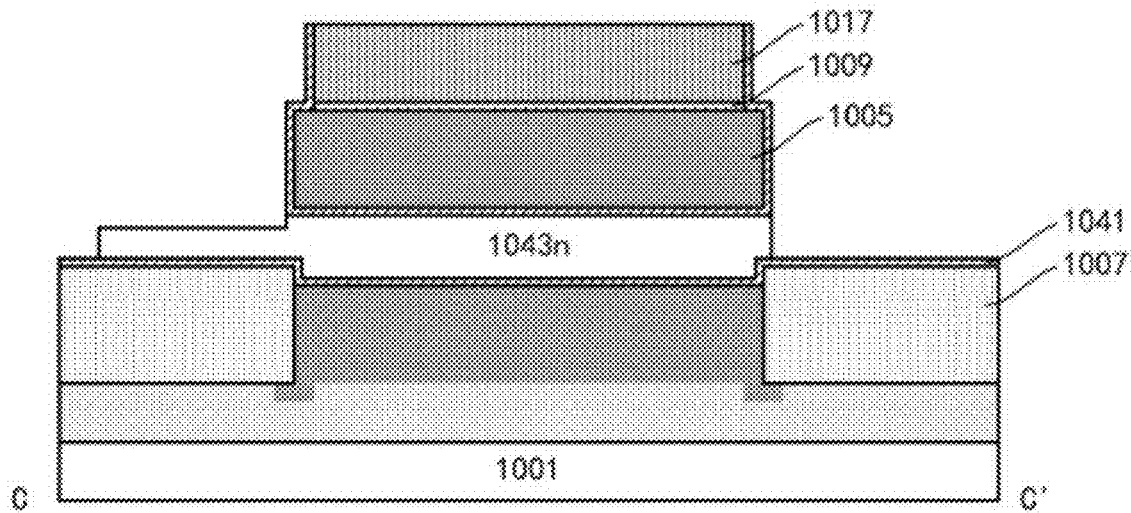
Figure 18D:
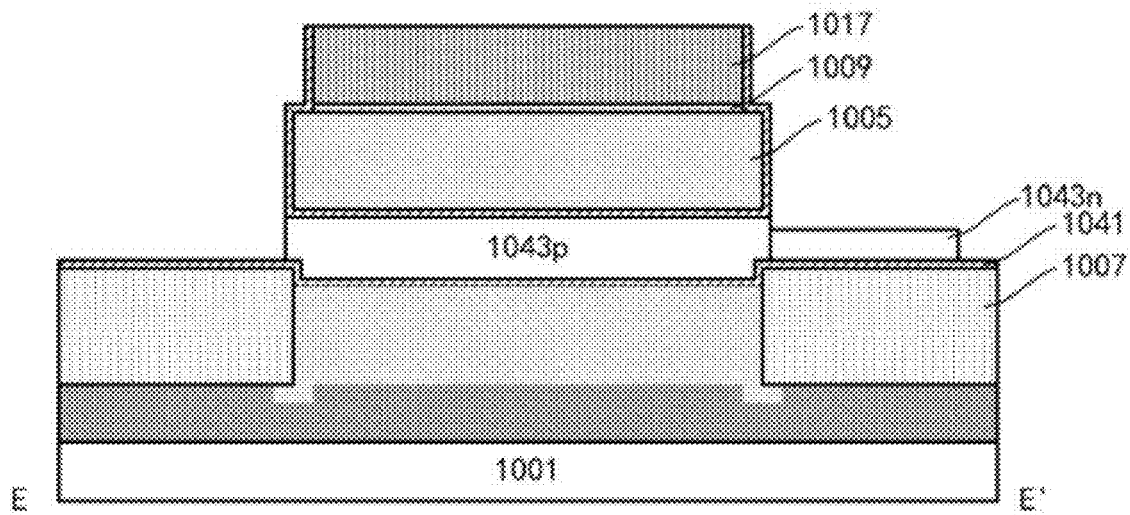
Figure 19A:
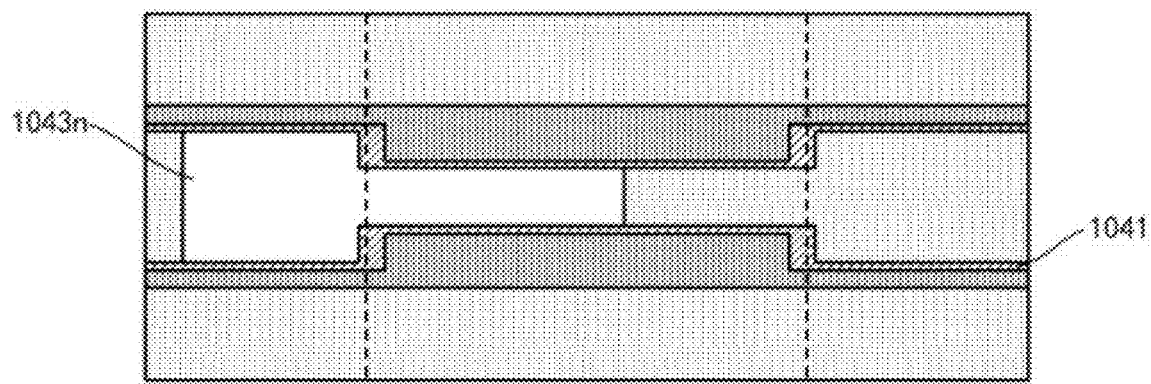
Figure 19B:
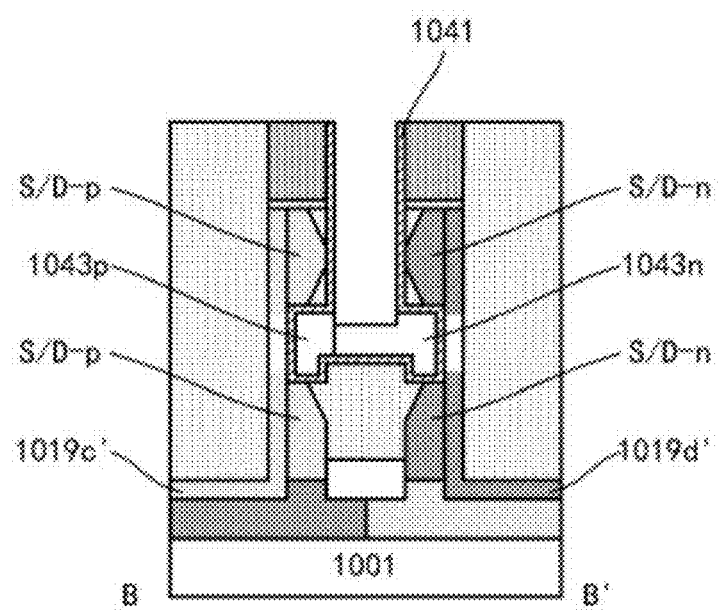
Figure 19C:
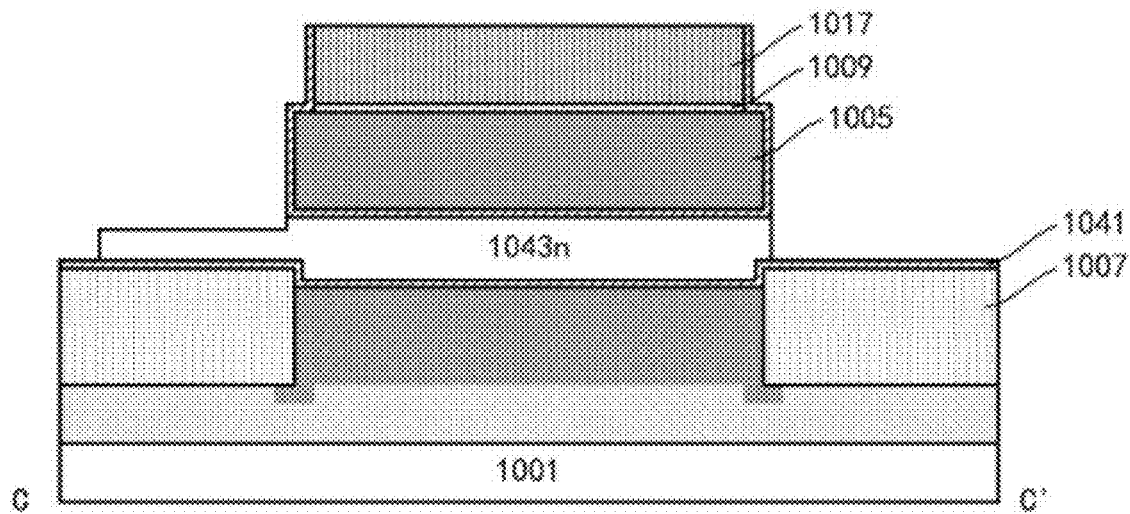
Figure 19D:
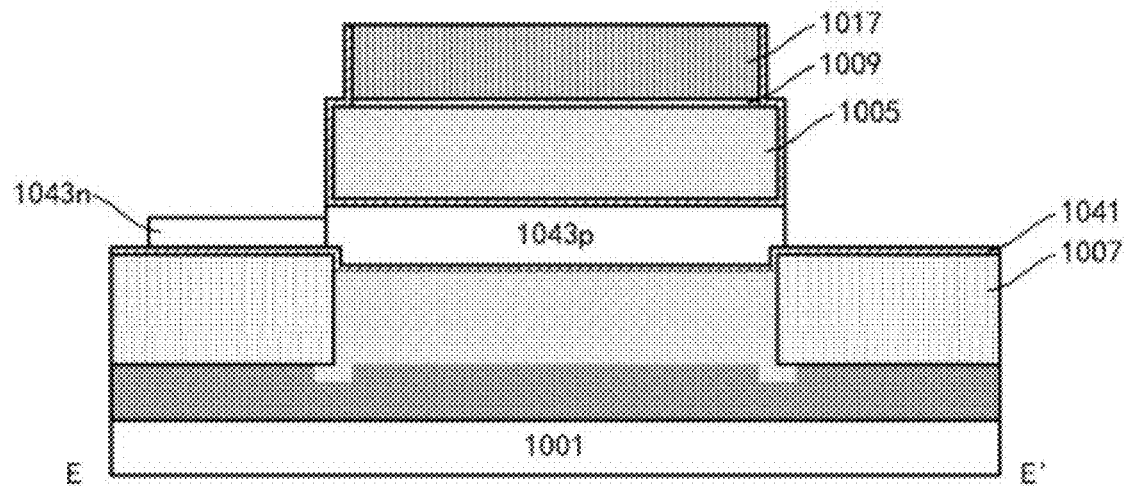

As shown in FIG. 18(a), the gate conductor layer 1043n is separated between the two opposing devices under the opposing spacer 1017, respectively. In addition, the gate conductor layer extends from the end portion of the active area to the isolation layer 1007, and has an enlarged area, thereby forming a landing pad. The landing pads of the two devices are located on different sides of the active area (the left and right sides in FIG. 18(a)), respectively, to avoid mutual influence.

FIGS. 19(a) to 19(d) show the structure obtained by etching the gate conductor layer 1043n according to the photoresist 1045' shown in FIG. 17(b).

So far, the fabrication of the device basic structure is completed. Subsequently, various contact portions, interconnect structures, etc. may be made.

Figure 20A:
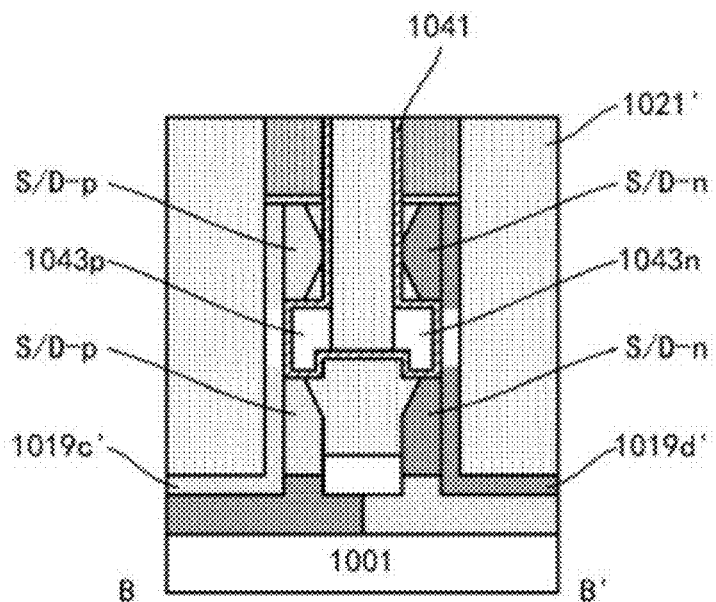
Figure 20B:
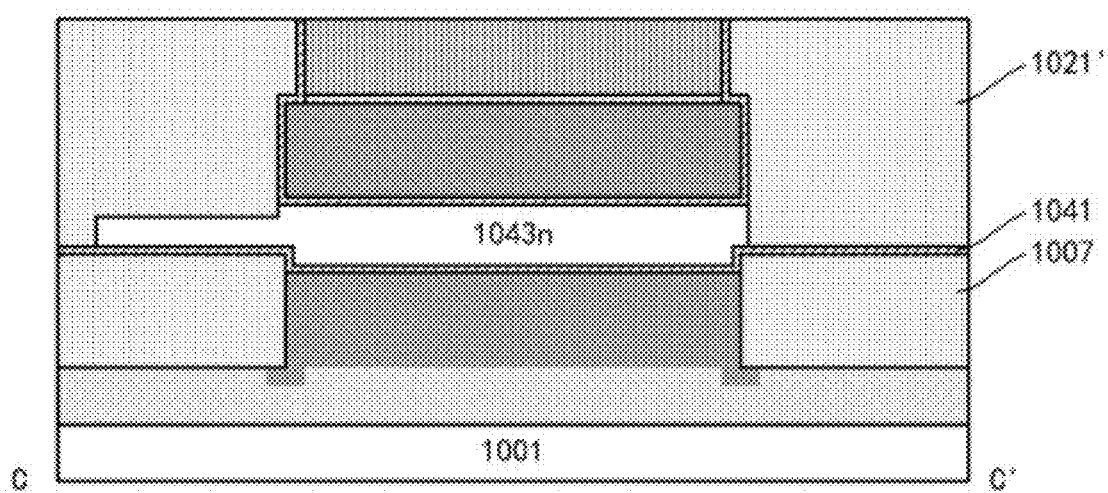
Figure 20C:
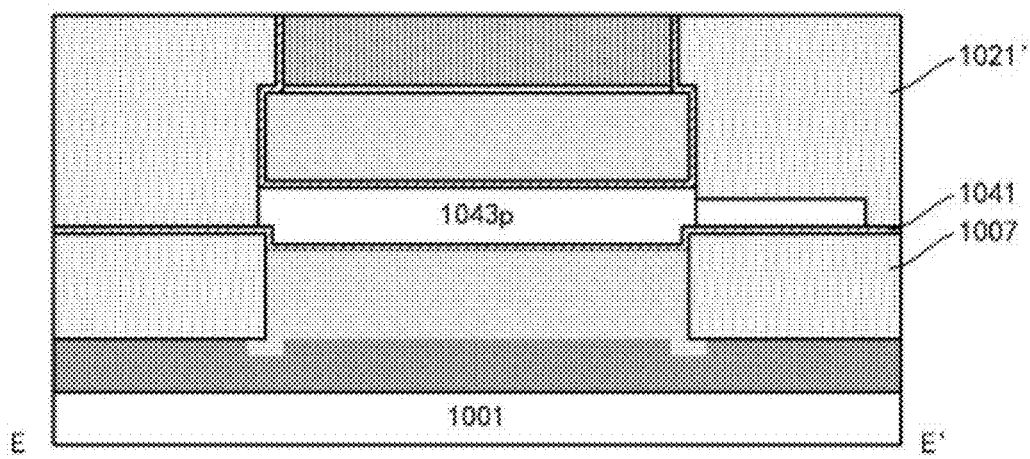

For example, as shown in FIGS. 20(a) to 20(c), the space on the inner side of the spacer 1017 may be filled with a dielectric material such as oxide (shown as 1021' along with the previous isolation layer) by, for example, deposition and then planarization.

Figure 21A:
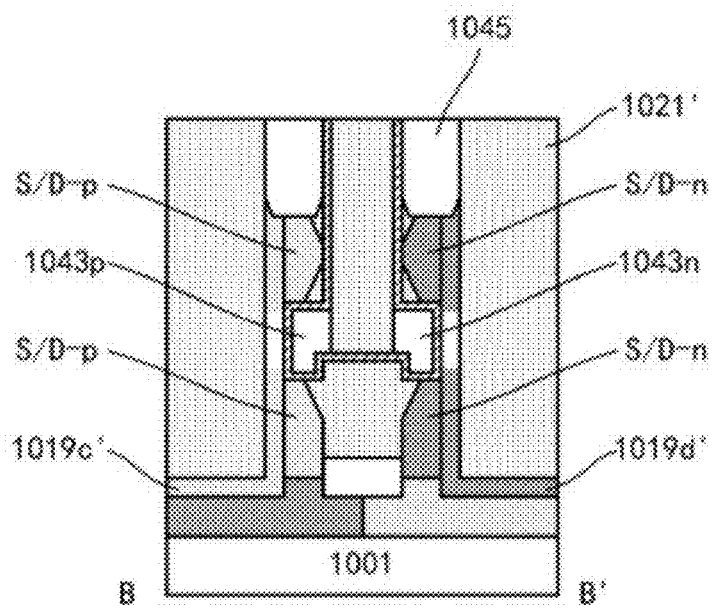
Figure 21B:
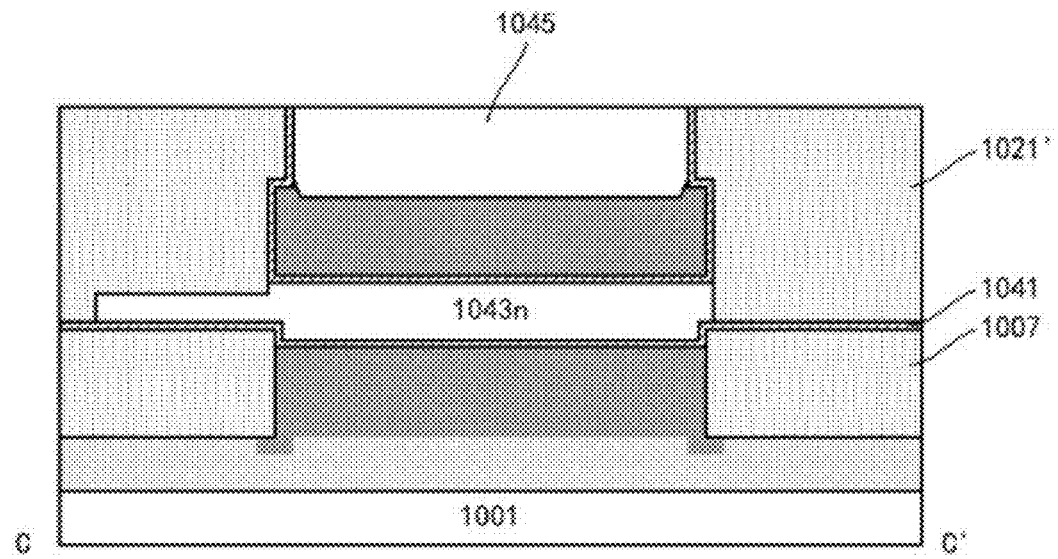
Figure 21C:
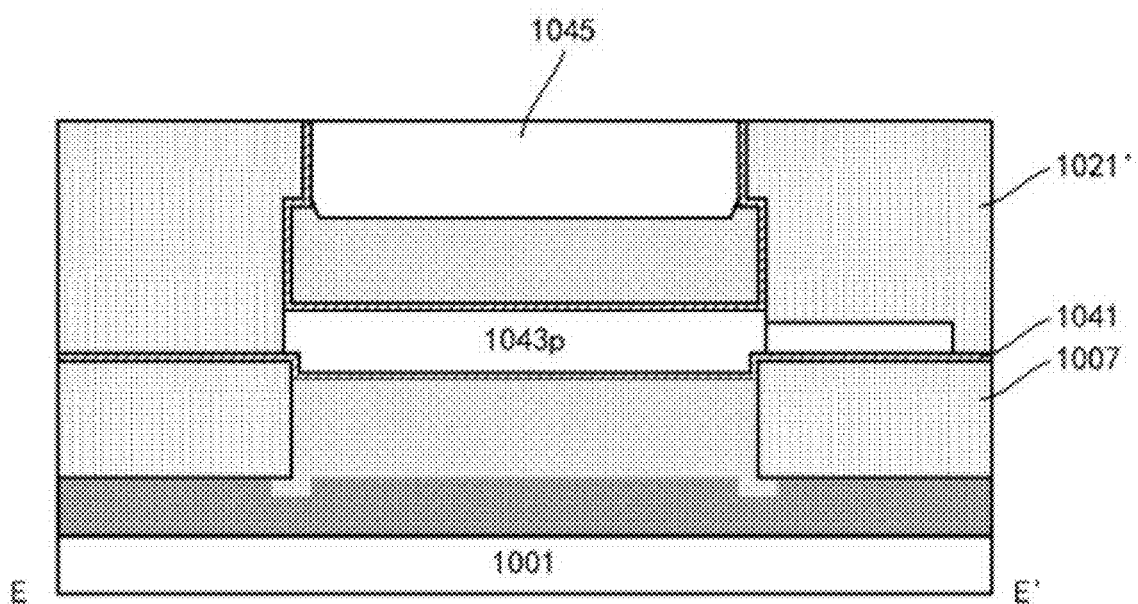

Here, the contact portion to the source/drain portion S/D at the upper end may be formed in a self-aligned manner. For example, as shown in FIGS. 21(a) to 21(c), the photoresist (not shown) may be used to shield the spacer 1017 on both sides of the active area, and the exposed spacer 1017 may be selectively etched such as RIE to at least partially expose the source/drain portion S/D at the upper end. Then, a conductive material such as metal may be filled in the space formed by the removal of the spacer 1017 to form a contact portion 1045 to the source/drain portion S/D at the upper end.

Figure 22A:
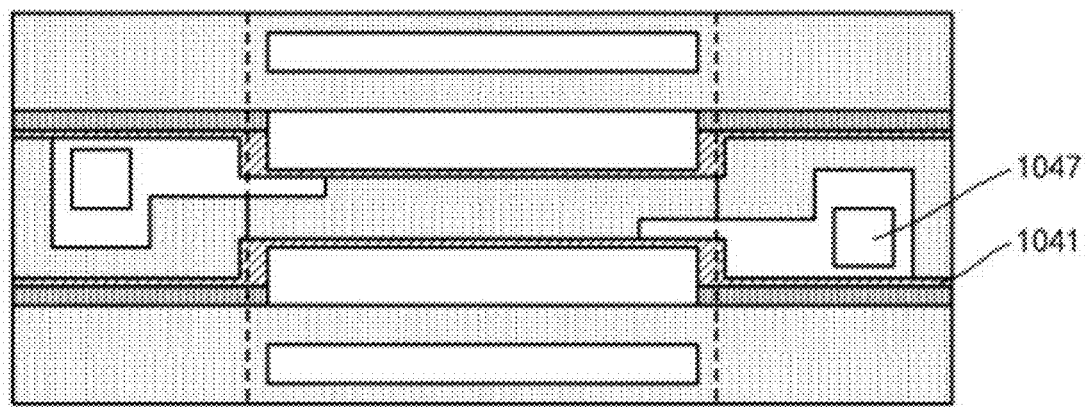
Figure 22B:
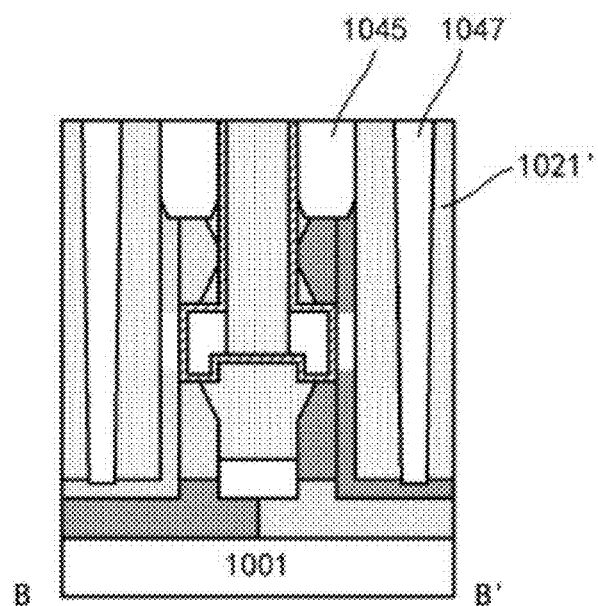
Figure 22C:
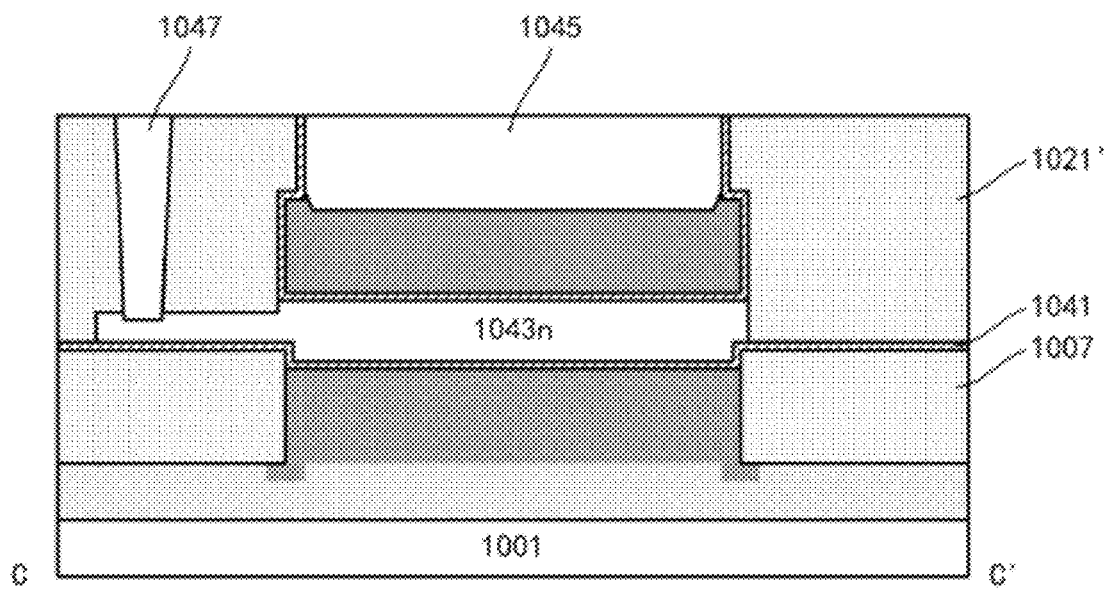
Figure 22D:
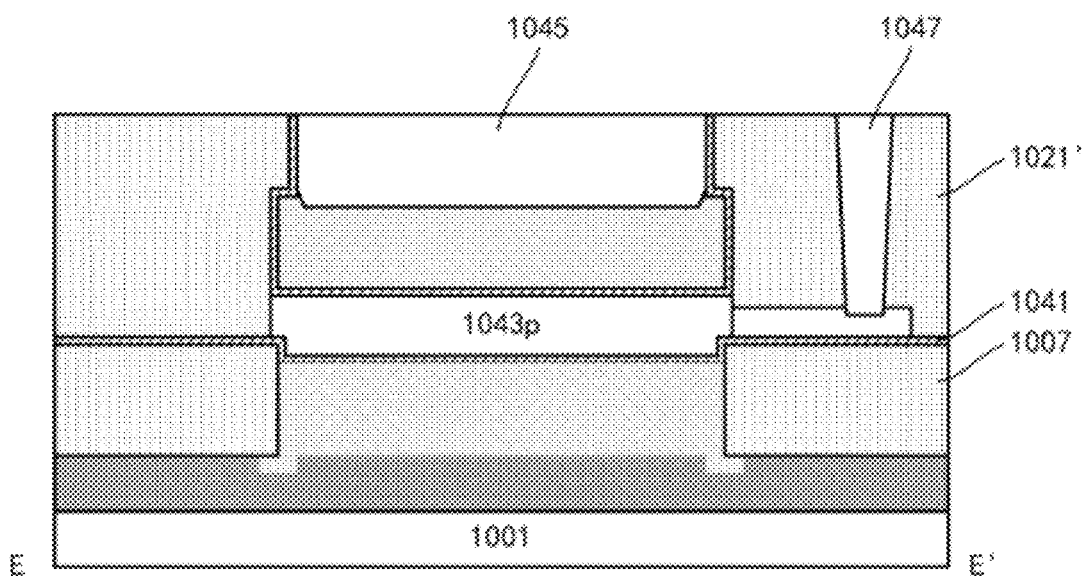

Then, as shown in FIGS. 22(a) to 22(c), a contact hole may be formed in the isolation layer 1021', and a conductive material such as metal may be filled in the contact hole to form a contact portion 1047. The contact portion 1047 may include a contact portion to the lower source/drain portion of each device and a contact portion to the gate conductor.

The semiconductor device according to the embodiments of the present disclosure may be applied to various electronic apparatuses. For example, it is possible to form an integrated circuit (IC) based on such a semiconductor device, and then to construct an electronic device. Therefore, the present disclosure also provides an electronic apparatus including the above-mentioned semiconductor device. The electronic apparatus may also include components such as a display screen matched with an integrated circuit and a wireless transceiver matched with an integrated circuit. Such the electronic apparatus includes smart phones, computers, tablet computers (PCs), wearable smart devices, mobile power supplies, and so on.

According to the embodiments of the present disclosure, a method of manufacturing a system on chip (SoC) is also provided. The method may include the method described above. Specifically, a variety of devices may be integrated on the chip, at least some of which are manufactured according to the method of the present disclosure.

In the above description, the technical details such as patterning and etching of each layer are not explained in detail. However, those skilled in the art should understand that various technical means may be used to form layers, regions, etc. of desired shapes. In addition, in order to form the same structure, those skilled in the art may also design a method that is not completely the same as the method described above. In addition, although the respective embodiments are described above respectively, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising a first device and a second device opposite to each other on a substrate, each of the first device and the second device comprising:

a channel portion extending vertically on the substrate;

source/drain portions located at the upper and lower ends of the channel portion and along the channel portion, wherein the source/drain portions extend toward a side of the channel portion in a transverse direction relative to the substrate, so that the source/drain portions and the channel portion constitute a C-shaped structure; and a gate stack overlapping the channel portion on the inner sidewall of the C-shaped structure, wherein the gate stack has a portion surrounded by the C-shaped structure, wherein an opening of the C-shaped structure of the first device and an opening of the C-shaped structure of the second device are opposite to each other, wherein at least a portion of the gate stack of the first device close to the channel portion and at least a portion of the gate stack of the second device close to the channel portion are substantially coplanar.

2. The semiconductor device according to claim 1, wherein at least one of the following is true:

an upper source/drain portion of the first device and an upper source/drain portion of the second device are substantially coplanar;

a lower source/drain portion of the first device and a lower source/drain portion of the second device are substantially coplanar.

3. The semiconductor device according to claim 1, wherein the channel portion of the first device and the channel portion of the second device substantially extend in parallel.

4. The semiconductor device according to claim 1, wherein at least of the following is true:

an interface between an upper source/drain portion of the first device and the channel portion of the first device and an interface between an upper source/drain portion of the second device and the channel portion of the second device are substantially coplanar;

an interface between a lower source/drain portion of the first device and the channel portion of the first device and an interface between a lower source/drain portion of the second device and the channel portion of the second device are substantially coplanar.

5. The semiconductor device according to claim 1, wherein a distance between a doped interface between an upper source/drain portion and the channel portion and an upper surface of the portion of the gate stack is substantially the same as a distance between a doped interface between a lower source/drain portion and the channel portion and a lower surface of the portion of the gate stack.

6. The semiconductor device according to claim 5, wherein the distance is 2 nm-10 nm.

7. The semiconductor device according to claim 1, wherein a protrusion extent of the source/drain portion of the first device relative to the channel portion of the first device is substantially the same as a protrusion extent of the source/drain portion of the second device relative to the channel portion of the second device.

8. The semiconductor device according to claim 1, wherein a gate conductor of the gate stack comprised in the first device comprises a first portion surrounded by the corresponding C-shaped structure and a second portion extending transversely from the first portion in a first direction parallel to a longitudinal extension direction of the channel portion, a gate conductor of the gate stack comprised in the second device comprises a third portion surrounded by the corresponding C-shaped structure and a fourth portion extending transversely from the first portion in a second direction parallel to a longitudinal extension direction of the channel portion and opposite to the first direction.

9. The semiconductor device according to claim 1, wherein a doped profile of the source/drain portion has an end portion that overlaps the gate stack.

10. The semiconductor device according to claim 1, wherein the channel portion and the upper and lower source/drain portions extend on the substrate in a first direction, and are located between isolation layers in the first direction.

11. The semiconductor device according to claim 10, wherein in the first direction, a gate conductor in the gate stack comprises a first portion surrounded by the C-shaped structure and a second portion extending from the first portion to the isolation layer.

12. The semiconductor device according to claim 11, wherein the second portion is enlarged relative to the first portion.

13. The semiconductor device according to claim 1, wherein the source/drain portion has a shape that tapers toward an inner side of the C-shaped structure in a cross-sectional view.

14. The semiconductor device according to claim 1, wherein the channel portion is formed in a first semiconductor layer, the first semiconductor layer extends vertically to the source/drain portions so that end portions at an upper and the lower ends constitute portions of the corresponding source/drain portions, respectively, the source/drain portions further comprise a second semiconductor layer and a third semiconductor layer on the end portions of the first semiconductor layer at the upper and the lower ends.

15. The semiconductor device according to claim 14, wherein the second semiconductor layer and the third semiconductor layer of each of the first device and the second device comprise materials different from the first semiconductor layer.

16. The semiconductor device according to claim 14, wherein the first semiconductor layer of the first device and the first semiconductor layer of the second device have different materials and/or thicknesses.

17. The semiconductor device according to claim 14, wherein the second semiconductor layer and the third semiconductor layer of the first device comprise a material different from a material of the second semiconductor layer and the third semiconductor layer of the second device.

18. The semiconductor device according to claim 14, wherein the third semiconductor layer is a part of the substrate.

19. The semiconductor device according to claim 14, wherein the first semiconductor layer comprises a first portion constituting at least a portion of an outer sidewall of the C-shaped structure and a second portion extending transversely from the first portion in a direction away from the outer sidewall of the C-shaped structure.

20. The semiconductor device according to claim 1, wherein an outer sidewall of the C-shaped structure is substantially flat.

21. The semiconductor device according to claim 12, wherein the channel portion and the source/drain portions comprise a single crystal semiconductor material.

22. The semiconductor device according to claim 1, further comprises: a contact portion on an upper source/drain portion, wherein the contact portion has a sidewall substantially coplanar with an outer sidewall of the C-shaped structure.

23. The semiconductor device according to claim 1, wherein the first device and the second device have different conductivity types.

24. The semiconductor device according to claim 23, wherein the first device and the second device constitute a complementary metal oxide semiconductor (CMOS) configuration.

25. The semiconductor device according to claim 23, wherein gate conductors in the gate stacks of the first device and the second device contact with each other and are electrically connected.

26. The semiconductor device according to claim 25, wherein a connection surface between the gate conductors of the first device and the second device is biased toward the first device.

27. The semiconductor device according to claim 23, wherein the first device and the second device are formed on well regions of different conductivity types on the substrate, respectively.

28. The semiconductor device according to claim 23, wherein the first device and the second device comprise the gate stacks of different equivalent work functions.

29. The semiconductor device according to claim 12, wherein:
the first device is a p-type device, the source/drain portions thereof apply compressive stress to the channel portion of the first device,
the second device is a n-type device, the source/drain portions thereof apply tensile stress to the channel portion of the second device.

30. An electronic apparatus, comprising the semiconductor device according to claim 1.

31. The electronic apparatus according to claim 30, comprising smart phones, computers, tablets, wearable smart devices, artificial intelligence devices, or mobile power supplies.

* * * * *